United States Patent
Wang et al.

(10) Patent No.: US 11,125,812 B2
(45) Date of Patent: Sep. 21, 2021

(54) CIRCUIT AGING DETECTION SENSOR BASED ON VOLTAGE COMPARISON

(71) Applicant: Ningbo University, Zhejiang (CN)

(72) Inventors: Pengjun Wang, Zhejiang (CN);
Haiming Zhang, Zhejiang (CN);
Yuejun Zhang, Zhejiang (CN);
Huihong Zhang, Zhejiang (CN);
Xiaotian Zhang, Zhejiang (CN);
Haizhen Yu, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 17/033,964

(22) Filed: Sep. 28, 2020

(65) Prior Publication Data

US 2021/0096172 A1 Apr. 1, 2021

(30) Foreign Application Priority Data

Sep. 26, 2019 (CN) .......................... 201910917482.X

(51) Int. Cl.
*G01R 31/28* (2006.01)

(52) U.S. Cl.
CPC ..... *G01R 31/2884* (2013.01); *G01R 31/2879* (2013.01)

(58) Field of Classification Search
CPC ............ G01R 31/2884; G01R 31/2879; G01R 31/2882; G01R 31/317; G01R 31/2856; G01R 31/003

USPC .......................... 324/537, 509, 500
See application file for complete search history.

(56) References Cited

U.S. PATENT DOCUMENTS

| 2012/0104518 A1* | 5/2012 | Salmaso ............... G01L 9/0042 257/415 |
| 2014/0167812 A1* | 6/2014 | Jain ........................ G06F 30/30 326/16 |
| 2020/0142000 A1* | 5/2020 | Wang ............... G01R 31/31725 |

* cited by examiner

*Primary Examiner* — Giovanni Astacio-Oquendo
(74) *Attorney, Agent, or Firm* — JCIPRNET

(57) ABSTRACT

The invention discloses a circuit aging detection sensor based on voltage comparison. A control circuit generates an aging voltage signal, a standard voltage signal and a reference voltage signal. The aging voltage signal passes through a first voltage-controlled oscillator to generate an aging frequency signal. The standard voltage signal passes through a second voltage-controlled oscillator to generate a standard frequency signal. The standard frequency signal and the aging frequency signal pass through an aging detection circuit to generate a frequency difference signal. A level signal generated by a serial data detector passes through a beat-frequency oscillator to generate a reset signal. A counter quantizes aging information, which is converted by a digital-analog converter into a quantized voltage signal. The quantized voltage signal is compared with the reference voltage signal by a voltage comparator, to generate a hopping signal at a voltage superposition node, and an aging signal is output.

8 Claims, 8 Drawing Sheets

40 inverters in total

CIRCUIT AGING DETECTION SENSOR BASED ON VOLTAGE COMPARISON

CROSS-REFERENCE TO RELATED APPLICATION

This application claims the priority benefit of China application serial no. 201910917482.X, filed on Sep. 26, 2019. The entirety of the above-mentioned patent application is hereby incorporated by reference herein and made a part of this specification.

TECHNICAL FIELD

The invention relates to a circuit aging detection sensor, in particular to a circuit aging detection sensor based on voltage comparison.

DESCRIPTION OF RELATED ART

The decrease of the process dimensions of integrated circuits and the constant improvement of the integrity of the integrated circuits highlight the remarkable advantages of ultra-large-scale integrated circuits in performance, power consumption, area and integrality, but also bring some reliability problems. The reliability problems of the integrated circuits are typically caused by process deviations, soft errors and the aging effect, and the impact of parameter variations caused by the aging effect on the integrated circuit will become increasingly prominent in the later stage of usage. The aging effect has become the major influence factor on the reliability of the integrated circuits. The present study shows that the aging effect typically includes negative bias temperature instability (NBTI), time dependent dielectric breakdown (TDDB), hot carrier injection (HCI), and the like. At the deep-nano stage of the process, NBTI will be the principal factor that may result in the aging effect, and under the effect of a negative gate voltage, a series of electrical parameters of PMOS (P-type metal-oxide-silicon) transistors will be degraded, which in turn results in damage to device gates and negative drifts of threshold voltage and finally increases the delay of internal circuits, thus leading to aging of the integrated circuits.

The reliability problems of the integrated circuits caused by the aging effect are research hotspots both at home and abroad, and some achievements have been gained by relevant study. Literature 1 (Liang Huaguo, Wang Jing, Huang Zhengfeng, et al, Configurable Aging Prediction Sensor Design [J], Journal of Circuits and Systems, 2013, 18(01): 205-211.) puts forward a scheme of an aging prediction sensor with configurable delay units. According to this scheme, different delay units are preset on the basis of a unit redundancy design to obtain different protective band-pass widths. Depending on different degrees of aging, different delay units are selected by selection switches to generate corresponding detection windows to satisfy detection requirements under different conditions. However, due to the fact that delay chain units with different delays have to be preset when this technique is implemented, the area overhead is increased to a certain extent; and meanwhile, since the protective band-pass width depends on the delays of the delay chain units and the delays of the delay chain units depend on the selection switches, the protective band-pass width is not really continuously tunable and is poor in flexibility, thus reducing the aging detection precision to some extent.

BRIEF SUMMARY OF THE INVENTION

The technical issue to be settled by the invention is to provide a circuit aging detection sensor based on voltage comparison.

The technical solution adopted by the invention to settle the aforesaid technical issue is as follows: a circuit aging detection sensor based on voltage comparison comprises a control circuit, two voltage-controlled oscillators of the same structure, an aging detection circuit, a serial data detector, a beat-frequency oscillator, an 8-bit counter, a digital-analog converter and a voltage comparator, wherein each voltage-controlled oscillator has an input terminal and an output terminal, the two voltage-controlled oscillators are referred to as a first voltage-controlled oscillator and a second voltage-controlled oscillator separately, the control circuit has a first voltage output terminal, a second voltage output terminal and a third voltage output terminal, the aging detection circuit has a first input terminal allowing an aging frequency to be accessed thereto, a second input terminal allowing a standard frequency to be accessed thereto, and an output terminal for outputting an aging detection signal, the serial data detector has a first input terminal allowing the aging detection signal to be accessed thereto, a second input terminal allowing the standard frequency to be accessed thereto, and an output terminal, the 8-bit counter has an input terminal, a reset terminal and an 8-bit parallel data output terminal, the digital-analog converter has an 8-bit parallel data input terminal and an output terminal, the voltage comparator has a first input terminal, a second input terminal and an output terminal, and the beat-frequency oscillator has an input terminal and an output terminal;

The first voltage output terminal of the control circuit is connected to the input terminal of the first voltage-controlled oscillator, the second voltage output terminal of the control circuit is connected to the input terminal of the second voltage-controlled oscillator, the third voltage output terminal of the control circuit is connected to the first input terminal of the voltage comparator, the output terminal of the first voltage-controlled oscillator is connected to the first input terminal of the aging detection circuit, the output terminal of the second voltage-controlled oscillator is connected to the second input terminal of the aging detection circuit, the input terminal of the 8-bit counter is connected to the second input terminal of the serial data detector, the output terminal of the aging detection circuit is connected to the first input terminal of the serial data detector, the output terminal of the serial data detector is connected to the input terminal of the beat-frequency oscillator, the output terminal of the beat-frequency oscillator is connected to the reset terminal of the 8-bit counter, the 8-bit parallel data output terminal of the 8-bit counter is connected to the 8-bit parallel data input terminal of the digital-analog converter in a one-to-one correspondence manner, the output terminal of the digital-analog converter is connected to the second input terminal of the voltage comparator, and the output terminal of the voltage comparator is an output terminal of the circuit aging detection sensor.

The control circuit generates three voltage signals, wherein a first voltage signal is an aging voltage signal VDC which is output by the first voltage output terminal, a second voltage signal is a standard voltage signal VDD which is output by the second voltage output terminal, a third voltage signal is a reference voltage signal VREF which is output by the third voltage output terminal, the aging voltage signal VDC passes through the first voltage-controlled oscillator to generate an aging frequency signal B, the standard voltage signal VDD passes through the second voltage-controlled oscillator to generate a standard frequency signal A, the standard frequency signal A and the aging frequency signal B are processed by the aging detection circuit, a frequency difference signal Y between the standard frequency signal A and the aging frequency signal B is generated by the aging detection circuit and is output by the output terminal of the aging detection circuit, the frequency difference signal Y and the standard frequency signal A are input to the serial data detector, the standard frequency signal A provides an operating frequency for the serial data detector, the serial data detector processes the frequency difference signal Y to extract a pulse signal from the frequency difference signal Y and converts the pulse signal into a level signal E which serves as a frequency detection domain, the level signal E passes through the beat-frequency oscillator to generate a signal RST which serves as a reset signal of the 8-bit counter, the 8-bit counter calculates the number of cycles of the standard frequency signal A within the range of the frequency detection domain to quantize aging information, then the quantized aging information is converted by the digital-analog converter into a quantized voltage signal VAG, which is input to the voltage comparator together with the reference voltage signal VREF, the voltage comparator generates a hopping signal at a voltage superposition node of the quantified voltage signal VAG and the reference voltage signal VREF; if the output terminal of the voltage comparator outputs a low level at this moment, it indicates that the current circuit is not aged; or, if the output terminal of the voltage comparator outputs a high level, it indicates that the current circuit has been aged.

The voltage comparator comprises a first PMOS transistor, a second PMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a tenth PMOS transistor, an eleventh PMOS transistor, a twelfth PMOS transistor, a thirteenth PMOS transistor, a fourteenth PMOS transistor, a fifteenth PMOS transistor, a sixteenth PMOS transistor, a seventeenth PMOS transistor, an eighteenth PMOS transistor, a first NMOS (N-type metal-oxide-silicon) transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a twelfth NMOS transistor, a thirteenth NMOS transistor, a fourteenth NMOS transistor, a fifteenth NMOS transistor, a sixteenth NMOS transistor, a seventeenth NMOS transistor, a first capacitor and a second capacitor, wherein a source of the first PMOS transistor, a source of the second PMOS transistor, a source of the fourth PMOS transistor, a source of the sixth PMOS transistor, a source of the seventh PMOS transistor, a source of the ninth PMOS transistor, a source of the twelfth PMOS transistor, a source of the fourteenth PMOS transistor, a source of the sixteenth PMOS transistor and a source of the eighteenth PMOS transistor are connected, a gate of the first PMOS transistor, a drain of the first PMOS transistor, a drain of the first NMOS transistor, a gate of the third PMOS transistor, a gate of the fifth PMOS transistor, a gate of the eighth PMOS transistor, a gate of the tenth PMOS transistor, a gate of the fifteenth PMOS transistor and a gate of the seventeenth PMOS transistor are connected, a drain of the second PMOS transistor and a source of the third PMOS transistor are connected, a gate of the second PMOS transistor, a gate of the fourth PMOS transistor, a drain of the fifth PMOS transistor, a drain of the fourth NMOS transistor, a gate of the sixth PMOS transistor, a gate of the seventh PMOS transistor, a gate of the ninth PMOS transistor and a gate of the twelfth PMOS transistor are connected, a drain of the third PMOS transistor, a drain of the second NMOS transistor, a gate of the first NMOS transistor, a gate of the third NMOS transistor and a gate of the fifth NMOS transistor are connected, a drain of the fourth PMOS transistor and a source of the fifth PMOS transistor are connected, a drain of the sixth PMOS transistor, a drain of the sixth NMOS transistor, a gate of the sixth NMOS transistor, a gate of the second NMOS transistor and a gate of the fourth NMOS transistor are connected, a drain of the seventh PMOS transistor and a source of the eighth PMOS transistor are connected, a drain of the eighth PMOS transistor, a drain of the seventh NMOS transistor, a gate of the eighth NMOS transistor, a gate of the twelfth NMOS transistor, a gate of the fourteenth NMOS transistor and a gate of the sixteenth NMOS transistor are connected, a drain of the ninth PMOS transistor and a source of the tenth PMOS transistor are connected, a drain of the tenth PMOS transistor, a gate of the seventh NMOS transistor, a gate of the ninth NMOS transistor, a drain of the ninth NMOS transistor, a gate of the thirteenth NMOS transistor and a gate of the fifteenth NMOS transistor are connected, a source of the eleventh PMOS transistor, a drain of the twelfth PMOS transistor and a source of the thirteenth PMOS transistor are connected, a gate of the eleventh PMOS transistor and a gate of the tenth NMOS transistor are connected, a connecting terminal is the second input terminal of the voltage comparator, a drain of the eleventh PMOS transistor, a source of the thirteenth NMOS transistor and a drain of the fourteenth NMOS transistor are connected, a drain of the thirteenth PMOS transistor, a source of the fifteenth NMOS transistor, a drain of the sixth NMOS transistor and one terminal of the second capacitor are connected, a gate of the thirteenth PMOS transistor and a gate of the eleventh NMOS transistor are connected, a connecting terminal is the first input terminal of the voltage comparator, a drain of the fourteenth PMOS transistor, a drain of the tenth NMOS transistor and a source of the fifteenth PMOS transistor are connected, a gate of the fourteenth PMOS transistor, a drain of the fifteenth PMOS transistor, a drain of the thirteenth NMOS transistor and a gate of the sixteenth PMOS transistor are connected, a drain of the sixteenth PMOS transistor, a source of the seventeenth PMOS transistor, a drain of the eleventh NMOS transistor and one terminal of the first capacitor are connected, a drain of the seventeenth PMOS transistor, a drain of the fifteenth NMOS transistor and a gate of the seventeenth NMOS transistor are connected, a drain of the eighteenth PMOS transistor, a drain of the seventeenth NMOS transistor, the other terminal of the first capacitor and the other terminal of the second capacitor are connected, a connecting terminal is the output terminal of the voltage comparator, a source of the first NMOS transistor, a source of the third NMOS transistor, a source of the fifth NMOS transistor, a source of the sixth NMOS transistor, a source of the eighth NMOS transistor, a source of the ninth NMOS transistor, a source of the twelfth NMOS transistor, a source of the fourteenth NMOS transistor, a source of the sixteenth NMOS transistor and a source of the seventeenth NMOS transistor are connected, a source of the second NMOS transistor and a drain of the third NMOS transistor are connected, a source of the fourth NMOS transistor and a drain of the fifth NMOS transistor are connected, a source of the seventh NMOS transistor and a drain of the eighth NMOS transistor are connected, and a source of the tenth NMOS transistor, a source of the eleventh NMOS transistor and a drain of the twelfth NMOS transistor are connected. According to the voltage comparator, the gate of the tenth NMOS transistor and the gate of the eleventh NMOS transistor are respectively used as the first input terminal and the second input terminal of the voltage comparator; a bias circuit is formed by the first, second, third, fourth, fifth, sixth, seventh, eighth and ninth NMOS transistors and the first, second, third, fourth, fifth, sixth, seventh, eighth and tenth PMOS transistors to provide a stable bias current and quiescent operating point for the voltage comparator circuit; a common-source amplification circuit is formed by the tenth, eleventh, twelfth, thirteenth, fourteenth, fifteenth and sixteenth NMOS transistors and the eleventh, twelfth, thirteenth, fourteenth, fifteenth, sixteenth and seventeenth PMOS transistors to amplify small current signals, so that small signal deviations can be compared, thus improving the information acquisition precision of the voltage comparator; and an output circuit is formed by the seventeenth NMOS transistor, the eighteenth PMOS transistor, the first capacitor and the second capacitor to output results, and the first capacitor and the second capacitor in the output circuit serve as load capacitors, so that the anti jamming capacity of output signals is enhanced.

Each voltage-controlled oscillator comprises 37 VCO (voltage-controlled oscillator, VCO) cells, wherein each VCO cell has a first input terminal, a second input terminal, a first output terminal, a second output terminal and a power terminal, a power supply is accessed to the power terminals of the 37 VCO cells, the first input terminal of the first VCO cell is connected to the first output terminal of the thirty-seventh VCO cell, a connecting terminal is the output terminal of the voltage-controlled oscillator, the second input terminal of the first VCO cell is connected to the second output terminal of the thirty-seventh VCO cell, the first output terminal of the $k^{th}$ VCO cell is connected to the first input terminal of the $(k+1)^{th}$ VCO cell, the second output terminal of the $k^{th}$ VCO cell is connected to the second input terminal of the $(k+1)^{th}$ VCO cell, and k=1, 2, . . . , 36. Each VCO cell comprises a nineteenth PMOS transistor, a twentieth PMOS transistor, an eighteenth NMOS transistor and a nineteenth NMOS transistor, wherein a source of the nineteenth PMOS transistor and a source of the twentieth PMOS transistor are connected, and a connecting terminal is the power terminal of the VCO cell; a gate of the nineteenth PMOS transistor, a drain of the twentieth PMOS transistor and a drain of the nineteenth NMOS transistor are connected, and a connecting terminal is the first output terminal of the VCO cell; a drain of the nineteenth PMOS transistor, a gate of the twentieth PMOS transistor and a drain of the eighteenth NMOS transistor are connected, and a connecting terminal is the second output terminal of the VCO cell; a gate of the eighteenth NMOS transistor is the first input terminal of the VCO cell; a gate of the nineteenth NMOS transistor is the second input terminal of the VCO cell; and a source of the eighteenth NMOS transistor and a source of the nineteenth NMOS transistor are grounded (i.e. receiving a voltage signal VSS).

The aging detection circuit comprises a twenty-first PMOS transistor, a twenty-second PMOS transistor, a twentieth NMOS transistor, a twenty-first NMOS transistor, a twenty-second NMOS transistor, a first inverter, a second inverter, a third inverter and a first two-input AND gate, wherein the first two-input AND gate has a first input terminal, a second input terminal and an output terminal, a power supply is accessed to a source of the twenty-first PMOS transistor and a source of the twenty-second PMOS transistor, a drain of the twenty-first PMOS transistor, a drain of the twentieth NMOS transistor, a gate of the twenty-second PMOS transistor and an input terminal of the first inverter are connected, a drain of the twenty-second PMOS transistor, an output terminal of the first inverter, a drain of the twenty-second NMOS transistor and an input terminal of the second inverter are connected, a gate of the twentieth NMOS transistor and the output terminal of the first two-input AND gate are connected, a source of the twentieth NMOS transistor and a drain of the twenty-first NMOS transistor are connected, a source of the twenty-first NMOS transistor and a source of the twenty-second NMOS transistor are grounded (i.e. receiving the voltage signal VSS), a gate of the twenty-second NMOS transistor, an output terminal of the second inverter and an input terminal of the third inverter are connected, an output terminal of the third inverter is the output terminal of the aging detection circuit, the first input terminal of the first two-input AND gate, a gate of the twenty-first PMOS transistor and a gate of the twenty-first NMOS transistor are connected, a connecting terminal is the first input terminal of the aging detection circuit, and the second input terminal of the first two-input AND gate is the second input terminal of the aging detection circuit.

The serial data detector comprises a twenty-third PMOS transistor, a twenty-fourth PMOS transistor, a twenty-fifth PMOS transistor, a twenty-sixth PMOS transistor, a twenty-seventh PMOS transistor, a twenty-eighth PMOS transistor, a twenty-ninth PMOS transistor, a thirtieth PMOS transistor, a thirty-first PMOS transistor, a thirty-second PMOS transistor, a thirty-third PMOS transistor, a thirty-fourth PMOS transistor, a twenty-third NMOS transistor, a twenty-fourth NMOS transistor, a twenty-fifth NMOS transistor, a twenty-sixth NMOS transistor, a twenty-seventh NMOS transistor, a twenty-eighth NMOS transistor, a twenty-ninth NMOS transistor, a thirtieth NMOS transistor, a thirty-first NMOS transistor, a thirty-second NMOS transistor, a thirty-third NMOS transistor, a thirty-fourth NMOS transistor, a second two-input AND gate, a third two-input AND gate, a fourth two-input AND gate, a first two-input NAND gate, a second two-input NAND gate, a fourth inverter, a fifth inverter, a sixth inverter, a seventh inverter, an eighth inverter, a ninth inverter, a tenth inverter, an eleventh inverter, a twelfth inverter, a thirteenth inverter, a fourteenth inverter and a fifteenth inverter, wherein each of the second two-input AND gate, the third two-input AND gate, the fourth two-input AND gate, the first two-input NAND gate and the second two-input NAND gate has a first input terminal, a second input terminal and an output terminal, a power supply is accessed to a source of the twenty-third PMOS transistor, a source of the twenty-fourth PMOS transistor, a source of the twenty-ninth PMOS transistor and a source of the thirtieth PMOS transistor, a gate of the twenty-third PMOS transistor, a gate of the twenty-ninth PMOS transistor, a gate of the twenty-fourth NMOS transistor, a gate of the thirtieth NMOS transistor, a gate of the thirty-first NMOS transistor, an output terminal of the tenth inverter, a gate of the thirty-third NMOS transistor, a gate of the thirty-second PMOS transistor and a gate of the thirty-fourth PMOS transistor are connected, a drain of the twenty-third PMOS transistor and a source of the twenty-fifth PMOS transistor are connected, a gate of the twenty-fourth PMOS transistor, an output terminal of the fourth inverter, a drain of the thirty-first PMOS transistor, a drain of the thirty-first NMOS transistor and a gate of the twenty-sixth NMOS transistor are connected, a drain of the twenty-fourth PMOS transistor and a source of the twenty-sixth PMOS transistor are connected, a gate of the twenty-fifth PMOS transistor, a gate of the twenty-third NMOS transistor and the output terminal of the second two-input AND gate are connected, a drain of the twenty-fifth PMOS transistor, a drain of the twenty-third NMOS transistor, a drain of the twenty-sixth PMOS transistor, a drain of the twenty-fourth NMOS transistor and an input terminal of the fourth inverter are connected, a gate of the twenty-sixth PMOS transistor, a gate of the twenty-fifth NMOS transistor, a gate of the twenty-seventh NMOS transistor, a gate of the twenty-eighth PMOS transistor, a gate of the thirty-first PMOS transistor, an output terminal of the ninth inverter, an input terminal of the tenth inverter, a gate of the thirty-third PMOS transistor, a gate of the thirty-second NMOS transistor and a gate of the thirty-fourth NMOS transistor are connected, a gate of the twenty-seventh PMOS transistor, a gate of the twenty-ninth NMOS transistor and the output terminal of the third two-input AND gate are connected, a source of the twenty-seventh PMOS transistor and a drain of the twenty-ninth PMOS transistor are connected, a drain of the twenty-seventh PMOS transistor, a drain of the twenty-ninth NMOS transistor, a drain of the thirtieth NMOS transistor, a drain of the twenty-eighth PMOS transistor and an input terminal of the twelfth inverter are connected, a source of the twenty-eighth PMOS transistor and a drain of the thirtieth PMOS transistor are connected, a gate of the thirtieth PMOS transistor, an output terminal of the twelfth inverter, a gate of the twenty-eighth NMOS transistor, a drain of the thirty-third NMOS transistor and a drain of the thirty-third PMOS transistor are connected, a source of the thirty-first PMOS transistor, a source of the thirty-first NMOS transistor, a drain of the thirty-second PMOS transistor, a drain of the thirty-second NMOS transistor and an input terminal of the fifth inverter are connected, a source of the thirty-second PMOS transistor, a source of the thirty-second NMOS transistor, an output terminal of the sixth inverter and an input terminal of the seventh inverter are connected, a source of the thirty-third PMOS transistor, a source of the thirty-third NMOS transistor, a drain of the thirty-fourth NMOS transistor, a drain of the thirty-fourth PMOS transistor and an input terminal of the thirteenth inverter are connected, a source of the thirty-fourth PMOS transistor, a source of the thirty-fourth NMOS transistor, an output terminal of the fourteenth inverter and an input terminal of the fifteenth inverter are connected, a source of the twenty-third NMOS transistor and a drain of the twenty-fifth NMOS transistor are connected, a source of the twenty-fourth NMOS transistor and a drain of the twenty-sixth NMOS transistor are connected, a source of the twenty-fifth NMOS transistor, a source of the twenty-sixth NMOS transistor, a source of the twenty-seventh NMOS transistor and a source of the twenty-eighth NMOS transistor are grounded (i.e. receiving the voltage signal VSS), a drain of the twenty-seventh NMOS transistor and a source of the twenty-ninth NMOS transistor are connected, a drain of the twenty-eighth NMOS transistor and a source of the thirtieth NMOS transistor are connected, the first input terminal of the first two-input NAND gate, an output terminal of the eighth inverter and the first input terminal of the fourth two-input AND gate are connected, the second input terminal of the first two-input NAND gate, the second input terminal of the second two-input NAND gate and an output terminal of the fifteenth inverter are connected, the output terminal of the first two-input NAND gate and the second input terminal of the second two-input AND gate are connected, the first input terminal of the second two-input NAND gate and an output terminal of the seventh inverter are connected, the output terminal of the second two-input NAND gate and the second input terminal of the third two-input AND gate are connected, the first input terminal of the second two-input AND gate and the first input terminal of the third two-input AND gate are connected, a connecting terminal is the first input terminal of the serial data detector, the second input terminal of the fourth two-input AND gate and an output terminal of the eleventh inverter are connected, the output terminal of the fourth two-input AND gate is the output terminal of the serial data detector, an output terminal of the fifth inverter, an input terminal of the sixth inverter and an input terminal of the eighth inverter are connected, an input terminal of the ninth inverter is the second input terminal of the serial data detector, and an input terminal of the eleventh inverter, an output terminal of the thirteenth inverter and an input terminal of the fourteenth inverter are connected. According to the serial data detector, a detection signal is input via the first input terminal of the second two-input AND gate, a standard frequency signal is input via the input terminal of the ninth inverter, the serial data detector processes the signal Y under the effect of the standard reference signal, and an output is output by the fourth two-input AND gate; and through the design of the AND gates, edge burrs can be eliminated, a pulse signal can be converted into a level signal to obtain an accurate range of the frequency detection domain, and the 8-bit counter can accurately calculate the number of cylinders of the standard frequency within the range of the frequency detection domain.

The beat-frequency oscillator comprises a delay chain, a sixteenth inverter and a first two-input NOR gate, wherein the first two-input NOR gate has a first input terminal, a second input terminal and an output terminal, an input terminal of the delay chain is connected to the first input terminal of the first two-input NOR gate, a connecting terminal is the input terminal of the beat-frequency oscillator, an output terminal of the delay chain is connected to the second input terminal of the first two-input NOR gate, the output terminal of the first two-input NOR gate is connected to an input terminal of the sixteenth inverter, and an output terminal of the sixteenth inverter is the output terminal of the beat-frequency oscillator; and the delay chain is formed by series connection of 40 inverters, an input terminal of a first inverter of the 40 inverters is an input terminal of the delay chain, and an output terminal of a fortieth inverter of the 40 inverters is an output terminal of the delay chain.

The 8-bit counter comprises a seventeenth inverter, an eighteenth inverter, a nineteenth inverter, a twentieth inverter, a twenty-first inverter, a twenty-second inverter, a twenty-third inverter, a twenty-fourth inverter, a first D flip-flop, a second D flip-flop, a third D flip-flop, a fourth D flip-flop, a fifth D flip-flop, a sixth D flip-flop, a seventh D flip-flop and an eighth D flip-flop. Each of the first D flip-flop, the second D flip-flop, the third D flip-flop, the fourth D flip-flop, the fifth D flip-flop, the sixth D flip-flop, the seventh D flip-flop and the eighth D flip-flop has a clock terminal, an input terminal, an output terminal and a reset terminal, wherein the reset terminals of the first D flip-flop, the second D flip-flop, the third D flip-flop, the fourth D flip-flop, the fifth D flip-flop, the sixth D flip-flop, the seventh D flip-flop and the eighth D flip-flop are connected, and a connecting terminal is the reset terminal of the 8-bit counter; the clock terminal of the first D flip-flop is the input terminal of the 8-bit counter, and the input terminal of the first D flip-flop is connected to an output terminal of the seventeenth inverter; the output terminal of the first D flip-flop, an input terminal of the seventeenth inverter and the clock terminal of the second D flip-flop are connected, and a connecting terminal is a first bit of the 8-bit parallel data output terminal of the 8-bit counter; the input terminal of the second D flip-flop is connected to an output terminal of the eighteenth inverter; the output terminal of the second D flip-flop, an input terminal of the eighteenth inverter and the clock terminal of the third D flip-flop are connected, and a connecting terminal is a second bit of the 8-bit parallel data output terminal of the 8-bit counter; the input terminal of the third D flip-flop is connected to an output terminal of the nineteenth inverter; the output terminal of the third D flip-flop, an input terminal of the nineteenth inverter and the clock terminal of the fourth D flip-flop are connected, and a connecting terminal is a third bit of the 8-bit parallel data output terminal of the 8-bit counter; the input terminal of the fourth D flip-flop is connected to an output terminal of the twentieth inverter; the output terminal of the fourth D flip-flop, an input terminal of the twentieth inverter and the clock terminal of the fifth D flip-flop are connected, and a connecting terminal is a fourth bit of the 8-bit parallel data output terminal of the 8-bit counter; the input terminal of the fifth D flip-flop is connected to an output terminal of the twenty-first inverter; the output terminal of the fifth D flip-flop, an input terminal of the twenty-first inverter and the clock terminal of the sixth D flip-flop are connected, and a connecting terminal is a fifth bit of the 8-bit parallel data output terminal of the 8-bit counter; the input terminal of the sixth D flip-flop is connected to an output terminal of the twenty-second inverter; the output terminal of the sixth D flip-flop, an input terminal of the twenty-second inverter and the clock terminal of the seventh D flip-flop are connected, and a connecting terminal is a sixth bit of the 8-bit parallel data output terminal of the 8-bit counter; the input terminal of the seventh D flip-flop is connected to an output terminal of the twenty-third inverter; the output terminal of the seventh D flip-flop, an input terminal of the twenty-third inverter and the clock terminal of the eighth D flip-flop are connected, and a connecting terminal is a seventh bit of the 8-bit parallel data output terminal of the 8-bit counter; the input terminal of the eighth D flip-flop is connected to an output terminal of the twenty-fourth inverter; and an input terminal of the twenty-fourth inverter and an output terminal of the eighth D flip-flop are connected, and a connecting terminal is an eighth bit of the 8-bit parallel data output terminal of the 8-bit counter.

The control circuit module comprises a first DC power supply for generating the aging voltage signal VDC, a second DC power supply for generating the standard voltage signal VDD, and a pulse power supply for generating the reference voltage signal VREF.

Compared with the prior art, the invention discloses the following: first of all, the control circuit generates a standard voltage signal, an aging voltage signal and a reference voltage signal, the first voltage-controlled oscillator and the second voltage-controlled oscillator are controlled by the aging voltage signal and the standard voltage signal separately to generate an aging frequency signal and a reference frequency signal, the aging detection circuit compares the aging frequency signal with the standard frequency signal to obtain a frequency difference, and the serial data detector converts a frequency difference signal into a level signal to obtain a frequency detection domain; afterwards, the 8-bit counter calculates the number of cycles of the standard frequency within the range of the frequency detection domain to quantize aging information to obtain a quantized signal, and a digital-analog converter converts the quantized signal into a quantized voltage signal for further processing; finally, a voltage comparison circuit compares a quantized voltage with a reference voltage and generates a hop at the signal superposition node, and then a high level or a low level is output to realize signal detection.

BRIEF DESCRIPTION OF THE SEVERAL VIEWS OF THE DRAWINGS

FIG. 7 ($b$) is a circuit diagram of a delay chain of the circuit aging detection sensor based on voltage comparison according to an embodiment of the invention.

DETAILED DESCRIPTION OF THE INVENTION

The invention is further expounded below in conjunction with the accompanying drawings and embodiments. A circuit aging detection sensor based on voltage comparison is provided. In some embodiment, the circuit aging detection sensor is small in area overhead, good in flexibility and high in aging detection precision.

Figure 1:
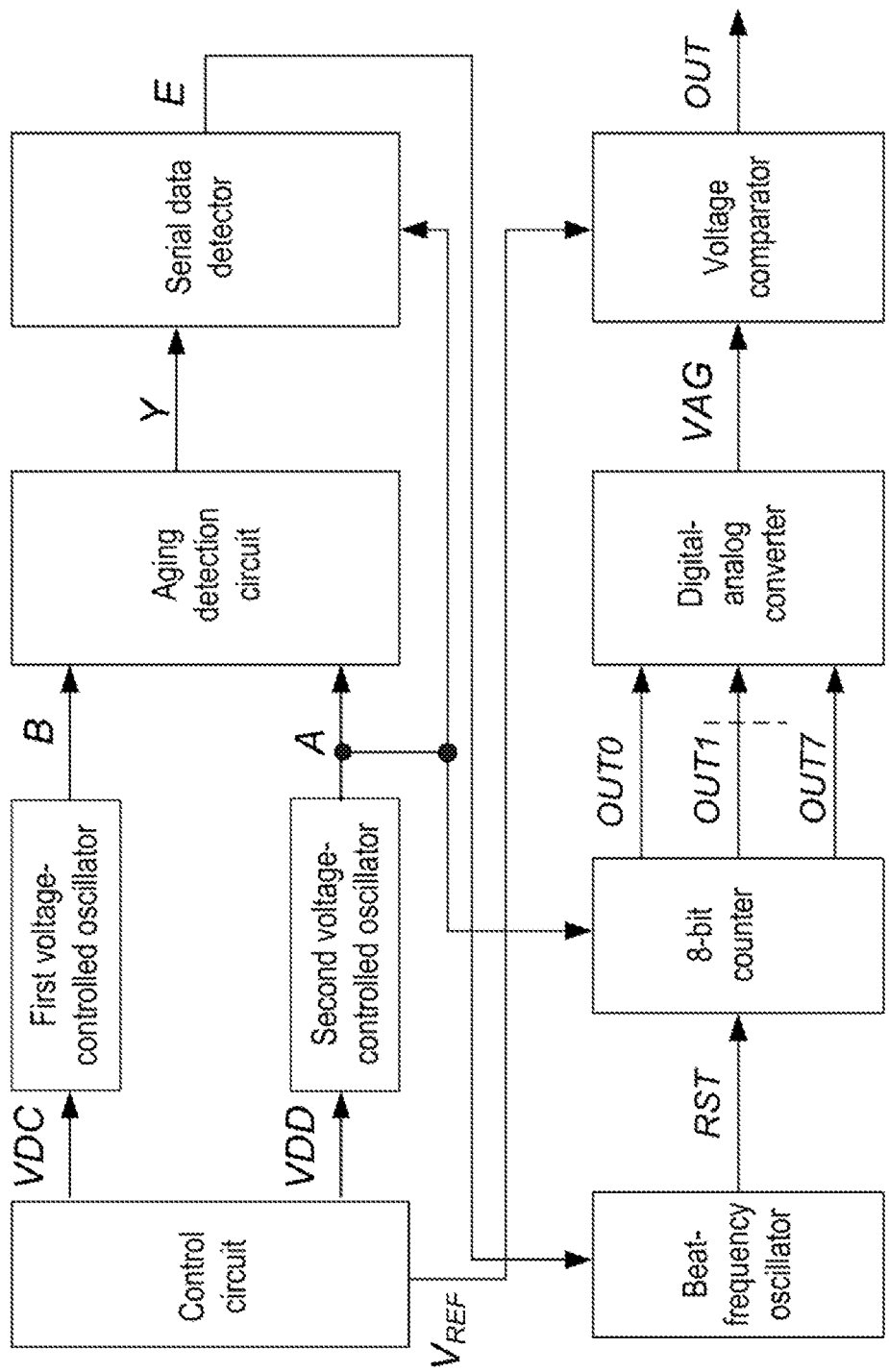
FIG. 1 is a principle and structural block diagram of a circuit aging detection sensor based on voltage comparison of the invention according to an embodiment of the invention.

Embodiment: As shown in FIG. 1, a circuit aging detection sensor based on voltage comparison comprises a control circuit, two voltage-controlled oscillators of the same structure, an aging detection circuit, a serial data detector, a beat-frequency oscillator, an 8-bit counter, a digital-analog converter and a voltage comparator, wherein each voltage-controlled oscillator has an input terminal and an output terminal, the two voltage-controlled oscillators are referred to as a first voltage-controlled oscillator and a second voltage-controlled oscillator separately, the control circuit has a first voltage output terminal, a second voltage output terminal and a third voltage output terminal, the aging detection circuit has a first input terminal allowing an aging frequency to be accessed thereto, a second input terminal allowing a standard frequency to be accessed thereto, and an output terminal for outputting an aging detection signal, the serial data detector has a first input terminal allowing the aging detection signal to be accessed thereto, a second input terminal allowing the standard frequency to be accessed thereto, and an output terminal, the 8-bit counter has an input terminal, a reset terminal and an 8-bit parallel data output terminal, the digital-analog converter has an 8-bit parallel data input terminal and an output terminal, the voltage comparator has a first input terminal, a second input terminal and an output terminal, and the beat-frequency oscillator has an input terminal and an output terminal; the first voltage output terminal of the control circuit is connected to the input terminal of the first voltage-controlled oscillator, the second voltage output terminal of the control circuit is connected to the input terminal of the second voltage-controlled oscillator, the third voltage output terminal of the control circuit is connected to the first input terminal of the voltage comparator, the output terminal of the first voltage-controlled oscillator is connected to the first input terminal of the aging detection circuit, the output terminal of the second voltage-controlled oscillator is connected to the second input terminal of the aging detection circuit, the input terminal of the 8-bit counter is connected to the second input terminal of the serial data detector, the output terminal of the aging detection circuit is connected to the first input terminal of the serial data detector, the output terminal of the serial data detector is connected to the input terminal of the beat-frequency oscillator, the output terminal of the beat-frequency oscillator is connected to the reset terminal of the 8-bit counter, the 8-bit parallel data output terminal of the 8-bit counter is connected to the 8-bit parallel data input terminal of the digital-analog in a one-to-one correspondence manner, the output terminal of the digital-analog converter is connected to the second input terminal of the voltage comparator, and the output terminal of the voltage comparator is an output terminal of the circuit aging detection sensor. The control circuit generates three voltage signals, wherein a first voltage signal is an aging voltage signal VDC which is output by the first voltage output terminal, a second voltage signal is a standard voltage signal VDD which is output by the second voltage output terminal, a third voltage signal is a reference voltage signal VREF which is output by the third voltage output terminal, the aging voltage signal VDC passes through the first voltage-controlled oscillator to generate an aging frequency signal B, the standard voltage signal VDD passes through the second voltage-controlled oscillator to generate a standard frequency signal A, the standard frequency signal A and the aging frequency signal B are processed by the aging detection circuit, a frequency difference signal Y between the standard frequency signal A and the aging frequency signal B is generated by the aging detection circuit and is output by the output terminal of the aging detection circuit, the frequency difference signal Y and the standard frequency signal A are input to the serial data detector, the standard frequency signal A provides an operating frequency for the serial data detector, the serial data detector processes the frequency difference signal Y to extract a pulse signal from the frequency difference signal Y and converts the pulse signal into a level signal E which serves as a frequency detection domain, the level signal E passes through the beat-frequency oscillator to generate a signal RST which serves as a reset signal of the 8-bit counter, the 8-bit counter calculates the number of cycles of the standard frequency signal A within the range of the frequency detection domain to quantize aging information, then the quantized aging information is converted by the digital-analog converter into a quantized voltage signal VAG, which is input to the voltage comparator together with the reference voltage signal VREF, the voltage comparator generates a hopping signal at a voltage superposition node of the quantified voltage signal VAG and the reference voltage signal VREF; if the output terminal of the voltage comparator outputs a low level at this moment, it indicates that the current circuit is not aged; or, if the output terminal of the voltage comparator outputs a high level, it indicates that the current circuit has been aged.

Figure 2:
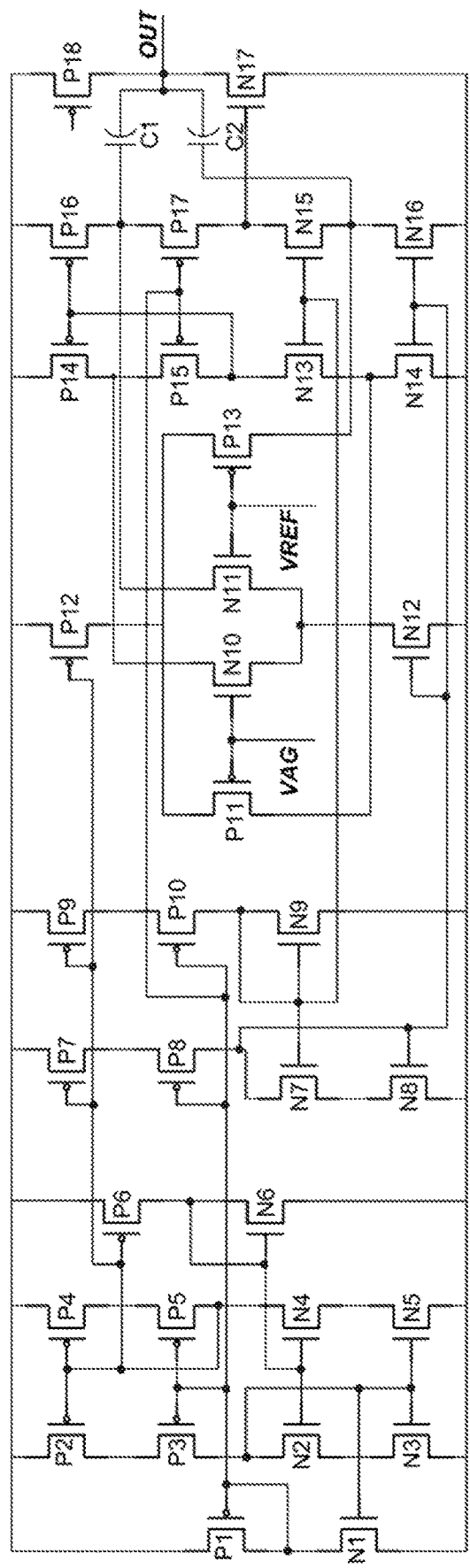
FIG. 2 is a circuit diagram of a voltage comparator of the circuit aging detection sensor based on voltage comparison according to an embodiment of the invention.

As shown in FIG. 2, in this embodiment, the voltage comparator comprises a first PMOS transistor P1, a second PMOS transistor P2, a third PMOS transistor P3, a fourth PMOS transistor P4, a fifth PMOS transistor P5, a sixth PMOS transistor P6, a seventh PMOS transistor P7, an eighth PMOS transistor P8, a ninth PMOS transistor P9, a tenth PMOS transistor P10, an eleventh PMOS transistor P11, a twelfth PMOS transistor P12, a thirteenth PMOS transistor P13, a fourteenth PMOS transistor P14, a fifteenth PMOS transistor P15, a sixteenth PMOS transistor P16, a seventeenth PMOS transistor P17, an eighteenth PMOS transistor P18, a first NMOS transistor N1, a second NMOS transistor N2, a third NMOS transistor N3, a fourth NMOS transistor N4, a fifth NMOS transistor N5, a sixth NMOS transistor N6, a seventh NMOS transistor N7, an eighth NMOS transistor N8, a ninth NMOS transistor N9, a tenth NMOS transistor N10, an eleventh NMOS transistor N11, a twelfth NMOS transistor N12, a thirteenth NMOS transistor N13, a fourteenth NMOS transistor N14, a fifteenth NMOS transistor N15, a sixteenth NMOS transistor N16, a seventeenth NMOS transistor N17, a first capacitor C1 and a second capacitor C2, wherein a source of the first PMOS transistor P1, a source of the second PMOS transistor P2, a source of the fourth PMOS transistor P4, a source of the sixth PMOS transistor P6, a source of the seventh PMOS transistor P7, a source of the ninth PMOS transistor P9, a source of the twelfth PMOS transistor P12, a source of the fourteenth PMOS transistor P14, a source of the sixteenth PMOS transistor P16 and a source of the eighteenth PMOS transistor P18 are connected, a gate of the first PMOS transistor P1, a drain of the first PMOS transistor P1, a drain of the first NMOS transistor N1, a gate of the third PMOS transistor P3, a gate of the fifth PMOS transistor P5, a gate of the eighth PMOS transistor P8, a gate of the tenth PMOS transistor P10, a gate of the fifteenth PMOS transistor P15 and a gate of the seventeenth PMOS transistor P17 are connected, a drain of the second PMOS transistor P2 and a source of the third PMOS transistor P3 are connected, a gate of the second PMOS transistor P2, a gate of the fourth PMOS transistor P4, a drain of the fifth PMOS transistor P5, a drain of the fourth NMOS transistor N4, a gate of the sixth PMOS transistor P6, a gate of the seventh PMOS transistor P7, a gate of the ninth PMOS transistor P9 and a gate of the twelfth PMOS transistor P12 are connected, a drain of the third PMOS transistor P3, a drain of the second NMOS transistor N2, a gate of the first NMOS transistor N1, a gate of the third NMOS transistor N3 and a gate of the fifth NMOS transistor N5 are connected, a drain of the fourth PMOS transistor P4 and a source of the fifth PMOS transistor P5 are connected, a drain of the sixth PMOS transistor P6, a drain of the sixth NMOS transistor N6, a gate of the sixth NMOS transistor N6, a gate of the second NMOS transistor N2 and a gate of the fourth NMOS transistor N4 are connected, a drain of the seventh PMOS transistor P7 and a source of the eighth PMOS transistor P8 are connected, a drain of the eighth PMOS transistor P8, a drain of the seventh NMOS transistor N7, a gate of the eighth NMOS transistor N8, a gate of the twelfth NMOS transistor N12, a gate of the fourteenth NMOS transistor N14 and a gate of the sixteenth NMOS transistor N16 are connected, a drain of the ninth PMOS transistor P9 and a source of the tenth PMOS transistor P10 are connected, a drain of the tenth PMOS transistor P10, a gate of the seventh NMOS transistor N7, a gate of the ninth NMOS transistor N9, a drain of the ninth NMOS transistor N9, a gate of the thirteenth NMOS transistor N13 and a gate of the fifteenth NMOS transistor N15 are connected, a source of the eleventh PMOS transistor P11, a drain of the twelfth PMOS transistor P12 and a source of the thirteenth PMOS transistor P13 are connected, a gate of the eleventh PMOS transistor P11 and a gate of the tenth NMOS transistor N10 are connected, a connecting terminal is the second input terminal of the voltage comparator, a drain of the eleventh PMOS transistor P11, a source of the thirteenth NMOS transistor N13 and a drain of the fourteenth NMOS transistor N14 are connected, a drain of the thirteenth PMOS transistor P13, a source of the fifteenth NMOS transistor N15, a drain of the sixth NMOS transistor N16 and one terminal of the second capacitor C2 are connected, a gate of the thirteenth PMOS transistor P13 and a gate of the eleventh NMOS transistor N11 are connected, a connecting terminal is the first input terminal of the voltage comparator, a drain of the fourteenth PMOS transistor P14, a drain of the tenth NMOS transistor N10 and a source of the fifteenth PMOS transistor P15 are connected, a gate of the fourteenth PMOS transistor P14, a drain of the fifteenth PMOS transistor P15, a drain of the thirteenth NMOS transistor N13 and a gate of the sixteenth PMOS transistor P16 are connected, a drain of the sixteenth PMOS transistor P16, a source of the seventeenth PMOS transistor P17, a drain of the eleventh NMOS transistor N11 and one terminal of the first capacitor C1 are connected, a drain of the seventeenth PMOS transistor P17, a drain of the fifteenth NMOS transistor N15 and a gate of the seventeenth NMOS transistor N17 are connected, a drain of the eighteenth PMOS transistor P18, a drain of the seventeenth NMOS transistor N17, the other terminal of the first capacitor C1 and the other terminal of the second capacitor C2 are connected, a connecting terminal is the output terminal of the voltage comparator, a source of the first NMOS transistor N1, a source of the third NMOS transistor N3, a source of the fifth NMOS transistor N5, a source of the sixth NMOS transistor N6, a source of the eighth NMOS transistor N8, a source of the ninth NMOS transistor N9, a source of the twelfth NMOS transistor N12, a source of the fourteenth NMOS transistor N14, a source of the sixteenth NMOS transistor N16 and a source of the seventeenth NMOS transistor N17 are connected, a source of the second NMOS transistor N2 and a drain of the third NMOS transistor N3 are connected, a source of the fourth NMOS transistor N4 and a drain of the fifth NMOS transistor N5 are connected, a source of the seventh NMOS transistor N7 and a drain of the eighth NMOS transistor N8 are connected, and a source of the tenth NMOS transistor N10, a source of the eleventh NMOS transistor N11 and a drain of the twelfth NMOS transistor N12 are connected.

Figure 3:
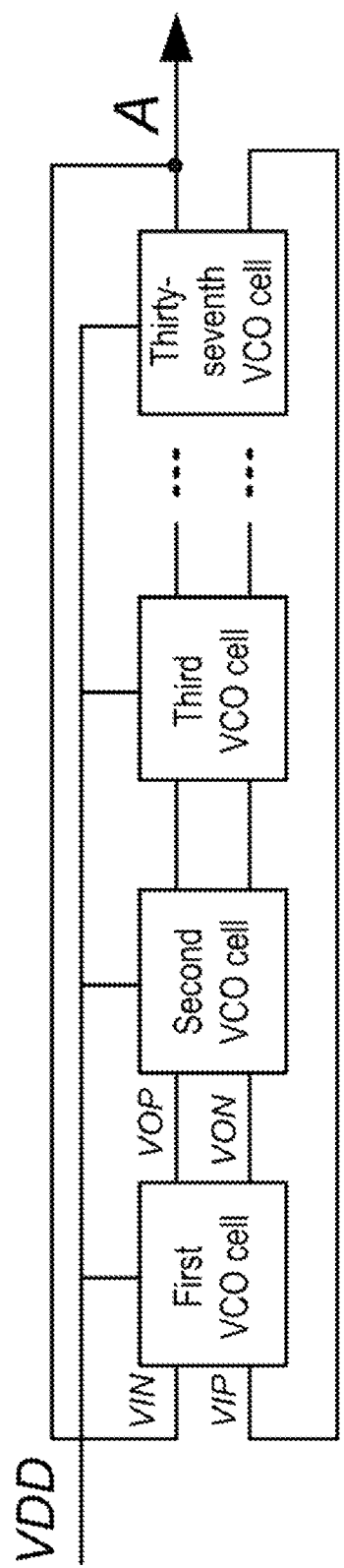
FIG. 3 is a circuit diagram of a voltage-controlled oscillator of the circuit aging detection sensor based on voltage comparison according to an embodiment of the invention.
Figure 4:
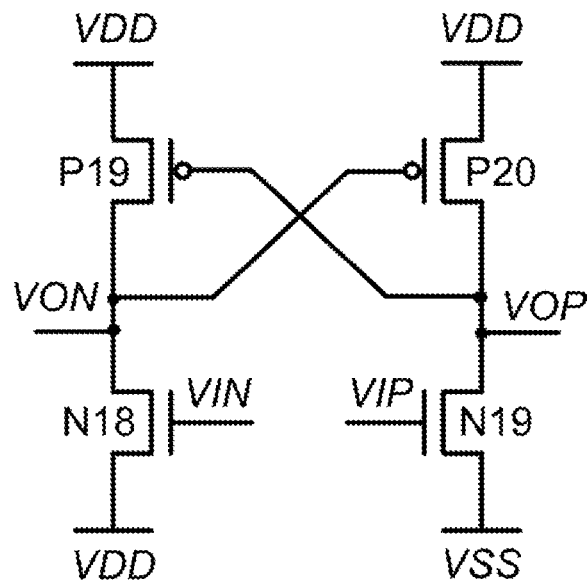
FIG. 4 is a circuit diagram of a reference VCO cell of the circuit aging detection sensor based on voltage comparison according to an embodiment of the invention.

As shown in FIG. 3 and FIG. 4, in this embodiment, each voltage-controlled oscillator comprises 37 VCO cells, wherein each VCO cell has a first input terminal, a second input terminal, a first output terminal, a second output terminal and a power terminal, a power supply is accessed to the power terminals of the 37 VCO cells, the first input terminal of the first VCO cell is connected to the first output terminal of the thirty-seventh VCO cell for receiving a voltage signal VIN, a connecting terminal is the output terminal of the voltage-controlled oscillator, the second input terminal of the first VCO cell is connected to the second output terminal of the thirty-seventh VCO cell for receiving a voltage signal VIP, the first output terminal of the $k^{th}$ VCO cell is connected to the first input terminal of the $(k+1)^{th}$ VCO cell, the second output terminal of the $k^{th}$ VCO cell is connected to the second input terminal of the $(k+1)^{th}$ VCO cell, and k=1, 2, . . . , 36. Each VCO cell comprises a nineteenth PMOS transistor P19, a twentieth PMOS transistor P20, an eighteenth NMOS transistor N18 and a nineteenth NMOS transistor N19, wherein a source of the nineteenth PMOS transistor P19 and a source of the twentieth PMOS transistor P20 are connected, and a connecting terminal is the power terminal of the VCO cell; a gate of the nineteenth PMOS transistor P19, a drain of the twentieth PMOS transistor P20 and a drain of the nineteenth NMOS transistor N19 are connected and a voltage signal VOP is generated thereof, and a connecting terminal is the first output terminal of the VCO cell; a drain of the nineteenth PMOS transistor P19, a gate of the twentieth PMOS transistor P20 and a drain of the eighteenth NMOS transistor N18 are connected and a voltage signal VON is generated thereof, and a connecting terminal is the second output terminal of the VCO cell; a gate of the eighteenth NMOS transistor N18 is the first input terminal of the VCO cell which receives a voltage signal VIN; a gate of the nineteenth NMOS transistor N19 is the second input terminal of the VCO cell which receives a voltage signal VIP; and a source of the eighteenth NMOS transistor N18 and a source of the nineteenth NMOS transistor N19 are grounded (i.e. receiving the voltage signal VSS).

Figure 5:
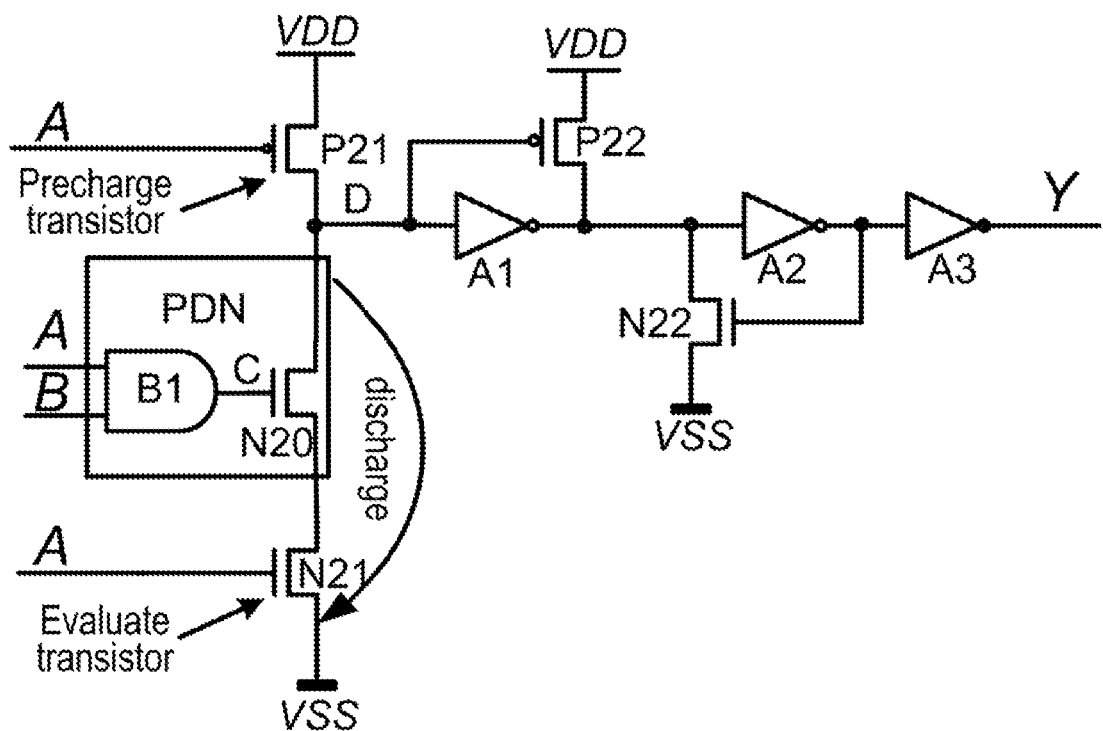
FIG. 5 is a circuit diagram of an aging detection circuit of the circuit aging detection sensor based on voltage comparison according to an embodiment of the invention.

As shown in FIG. 5, in this embodiment, the aging detection circuit comprises a twenty-first PMOS transistor P21, a twenty-second PMOS transistor P22, a twentieth NMOS transistor N20, a twenty-first NMOS transistor N21, a twenty-second NMOS transistor N22, a first inverter A1, a second inverter A2, a third inverter A3 and a first two-input AND gate B1, wherein a pull-down network PDN is formed by the first two-input AND gate B1 and the twenty-first NMOS transistor N21, the first two-input AND gate B1 has a first input terminal, a second input terminal and an output terminal, a power supply is accessed to a source of the twenty-first PMOS transistor P21 and a source of the twenty-second PMOS transistor P22, a drain of the twenty-first PMOS transistor P21, a drain of the twentieth NMOS transistor N20, a gate of the twenty-second PMOS transistor P22 and an input terminal of the first inverter A1 are connected, a drain of the twenty-second PMOS transistor P22, an output terminal of the first inverter A1, a drain of the twenty-second NMOS transistor N22 and an input terminal of the second inverter A2 are connected, a gate of the twentieth NMOS transistor N20 and the output terminal of the first two-input AND gate B1 are connected, a source of the twentieth NMOS transistor N20 and a drain of the twenty-first NMOS transistor N21 are connected, a source of the twenty-first NMOS transistor N21 and a source of the twenty-second NMOS transistor N22 are grounded (i.e. receiving the voltage signal VSS), a gate of the twenty-second NMOS transistor N22, an output terminal of the second inverter A2 and an input terminal of the third inverter A3 are connected, an output terminal of the third inverter A3 is the output terminal of the aging detection circuit, the first input terminal of the first two-input AND gate B1, a gate of the twenty-first PMOS transistor P21 and a gate of the twenty-first NMOS transistor N21 are connected, a connecting terminal is the first input terminal of the aging detection circuit, and the second input terminal of the first two-input AND gate B1 is the second input terminal of the aging detection circuit.

Figure 6:
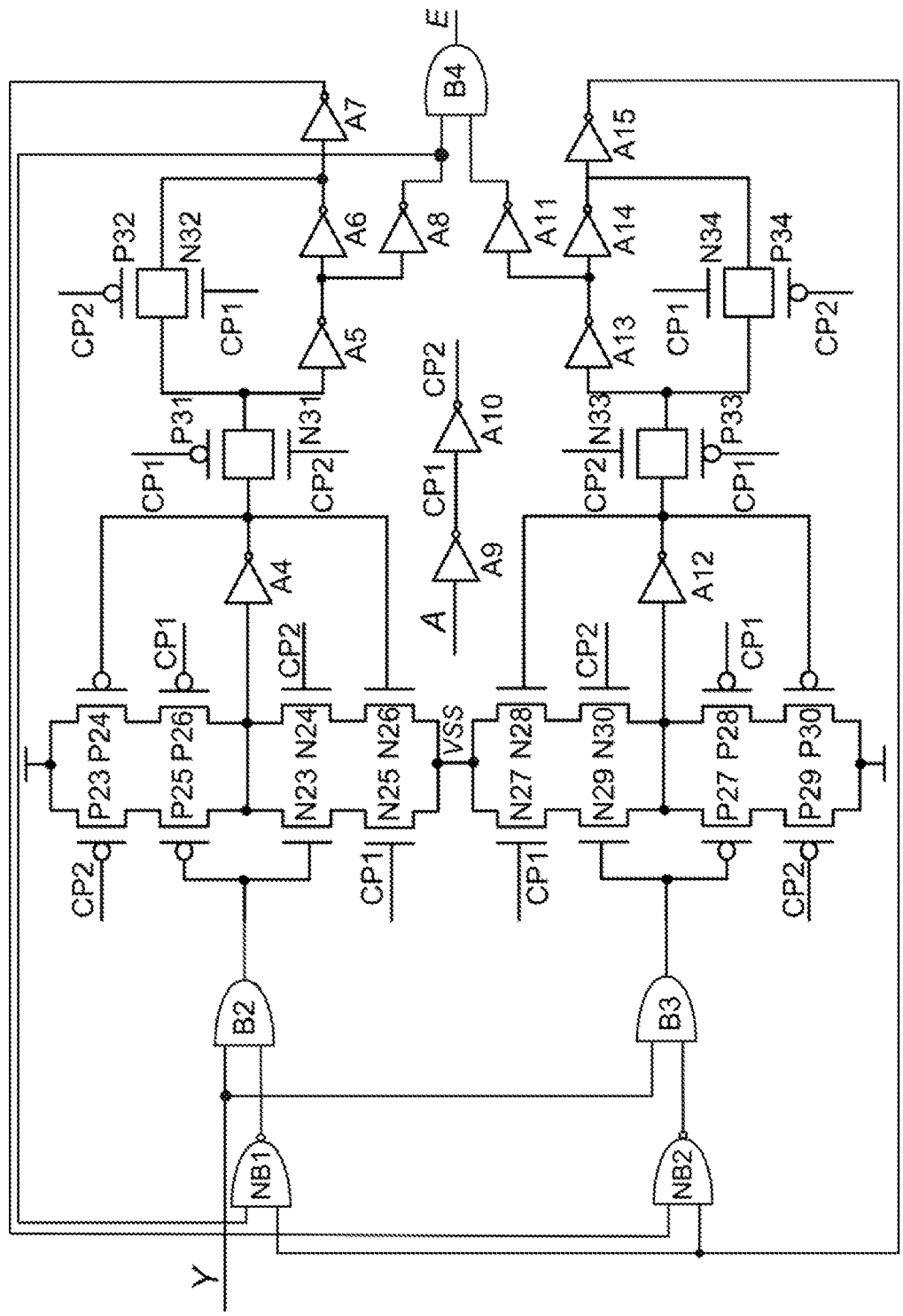
FIG. 6 is a circuit diagram of a serial data detector of the circuit aging detection sensor based on voltage comparison according to an embodiment of the invention.

As shown in FIG. 6, in this embodiment, the serial data detector comprises a twenty-third PMOS transistor P23, a twenty-fourth PMOS transistor P24, a twenty-fifth PMOS transistor P25, a twenty-sixth PMOS transistor P26, a twenty-seventh PMOS transistor P27, a twenty-eighth PMOS transistor P28, a twenty-ninth PMOS transistor P29, a thirtieth PMOS transistor P30, a thirty-first PMOS transistor P31, a thirty-second PMOS transistor P32, a thirty-third PMOS transistor P33, a thirty-fourth PMOS transistor P34, a twenty-third NMOS transistor N23, a twenty-fourth NMOS transistor N24, a twenty-fifth NMOS transistor N25, a twenty-sixth NMOS transistor N26, a twenty-seventh NMOS transistor N27, a twenty-eighth NMOS transistor N28, a twenty-ninth NMOS transistor N29, a thirtieth NMOS transistor N30, a thirty-first NMOS transistor N31, a thirty-second NMOS transistor N32, a thirty-third NMOS transistor N33, a thirty-fourth NMOS transistor N34, a second two-input AND gate B2, a third two-input AND gate B3, a fourth two-input AND gate B4, a first two-input NAND gate NB1, a second two-input NAND gate NB2, a fourth inverter A4, a fifth inverter A5, a sixth inverter A6, a seventh inverter A7, an eighth inverter A8, a ninth inverter A9, a tenth inverter A10, an eleventh inverter A11, a twelfth inverter A12, a thirteenth inverter A13, a fourteenth inverter A14 and a fifteenth inverter A15, wherein each of the second two-input AND gate B2, the third two-input AND gate B3, the fourth two-input AND gate B4, the first two-input NAND gate NB1 and the second two-input NAND gate NB2 has a first input terminal, a second input terminal and an output terminal, a power supply is accessed to a source of the twenty-third PMOS transistor P23, a source of the twenty-fourth PMOS transistor P24, a source of the twenty-ninth PMOS transistor P29 and a source of the thirtieth PMOS transistor P30, a gate of the twenty-third PMOS transistor P23, a gate of the twenty-ninth PMOS transistor P29, a gate of the twenty-fourth NMOS transistor N24, a gate of the thirtieth NMOS transistor N30, a gate of the thirty-first NMOS transistor N31, an output terminal of the tenth inverter A10, a gate of the thirty-third NMOS transistor N33, a gate of the thirty-second PMOS transistor P32 and a gate of the thirty-fourth PMOS transistor P34 are connected, a drain of the twenty-third PMOS transistor P23 and a source of the twenty-fifth PMOS transistor P25 are connected, a gate of the twenty-fourth PMOS transistor P24, an output terminal of the fourth inverter A4, a drain of the thirty-first PMOS transistor P31, a drain of the thirty-first NMOS transistor N31 and a gate of the twenty-sixth NMOS transistor N26 are connected, a drain of the twenty-fourth PMOS transistor P24 and a source of the twenty-sixth PMOS transistor P26 are connected, a gate of the twenty-fifth PMOS transistor P25, a gate of the twenty-third NMOS transistor N23 and the output terminal of the second two-input AND gate B2 are connected, a drain of the twenty-fifth PMOS transistor P25, a drain of the twenty-third NMOS transistor N23, a drain of the twenty-sixth PMOS transistor P26, a drain of the twenty-fourth NMOS transistor N24 and an input terminal of the fourth inverter A4 are connected, a gate of the twenty-sixth PMOS transistor P26, a gate of the twenty-fifth NMOS transistor N25, a gate of the twenty-seventh NMOS transistor N27, a gate of the twenty-eighth PMOS transistor P28, a gate of the thirty-first PMOS transistor P31, an output terminal of the ninth inverter A9, an input terminal of the tenth inverter A10, a gate of the thirty-third PMOS transistor P33, a gate of the thirty-second NMOS transistor N32 and a gate of the thirty-fourth NMOS transistor N34 are connected, a gate of the twenty-seventh PMOS transistor P27, a gate of the twenty-ninth NMOS transistor N29 and the output terminal of the third two-input AND gate B3 are connected, a source of the twenty-seventh PMOS transistor P27 and a drain of the twenty-ninth PMOS transistor P29 are connected, a drain of the twenty-seventh PMOS transistor P27, a drain of the twenty-ninth NMOS transistor N29, a drain of the thirtieth NMOS transistor N30, a drain of the twenty-eighth PMOS transistor P28 and an input terminal of the twelfth inverter A12 are connected, a source of the twenty-eighth PMOS transistor P28 and a drain of the thirtieth PMOS transistor P30 are connected, a gate of the thirtieth PMOS transistor P30, an output terminal of the twelfth inverter A12, a gate of the twenty-eighth NMOS transistor N28, a drain of the thirty-third NMOS transistor N33 and a drain of the thirty-third PMOS transistor P33 are connected, a source of the thirty-first PMOS transistor P31, a source of the thirty-first NMOS transistor N31, a drain of the thirty-second PMOS transistor P32, a drain of the thirty-second NMOS transistor N32 and an input terminal of the fifth inverter A5 are connected, a source of the thirty-second PMOS transistor P32, a source of the thirty-second NMOS transistor N32, an output terminal of the sixth inverter A6 and an input terminal of the seventh inverter A7 are connected, a source of the thirty-third PMOS transistor P33, a source of the thirty-third NMOS transistor N33, a drain of the thirty-fourth NMOS transistor N34, a drain of the thirty-fourth PMOS transistor P34 and an input terminal of the thirteenth inverter A13 are connected, a source of the thirty-fourth PMOS transistor P34, a source of the thirty-fourth NMOS transistor N34, an output terminal of the fourteenth inverter A14 and an input terminal of the fifteenth inverter A15 are connected, a source of the twenty-third NMOS transistor N23 and a drain of the twenty-fifth NMOS transistor N25 are connected, a source of the twenty-fourth NMOS transistor N24 and a drain of the twenty-sixth NMOS transistor N26 are connected, a source of the twenty-fifth NMOS transistor, a source of the twenty-sixth NMOS transistor N26, a source of the twenty-seventh NMOS transistor N27 and a source of the twenty-eighth NMOS transistor N28 are grounded (i.e. receiving the voltage signal VSS), a drain of the twenty-seventh NMOS transistor N27 and a source of the twenty-ninth NMOS transistor N29 are connected, a drain of the twenty-eighth NMOS transistor N28 and a source of the thirtieth NMOS transistor N30 are connected, the first input terminal of the first two-input NAND gate NB1, an output terminal of the eighth inverter A8 and the first input terminal of the fourth two-input AND gate B4 are connected, the second input terminal of the first two-input NAND gate NB1, the second input terminal of the second two-input NAND gate NB2 and an output terminal of the fifteenth inverter A15 are connected, the output terminal of the first two-input NAND gate NB1 and the second input terminal of the second two-input AND gate B2 are connected, the first input terminal of the second two-input NAND gate NB2 and an output terminal of the seventh inverter A7 are connected, the output terminal of the second two-input NAND gate NB2 and the second input terminal of the third two-input AND gate B3 are connected, the first input terminal of the second two-input AND gate B2 and the first input terminal of the third two-input AND gate B3 are connected, a connecting terminal is the first input terminal of the serial data detector, the second input terminal of the fourth two-input AND gate B4 and an output terminal of the eleventh inverter A11 are connected, the output terminal of the fourth two-input AND gate B4 is the output terminal of the serial data detector, an output terminal of the fifth inverter A5, an input terminal of the sixth inverter A6 and an input terminal of the eighth inverter A8 are connected, an input terminal of the ninth inverter A9 is the second input terminal of the serial data detector, and an input terminal of the eleventh inverter A11, an output terminal of the thirteenth inverter A13 and an input terminal of the fourteenth inverter A14 are connected.

Figure 7A:
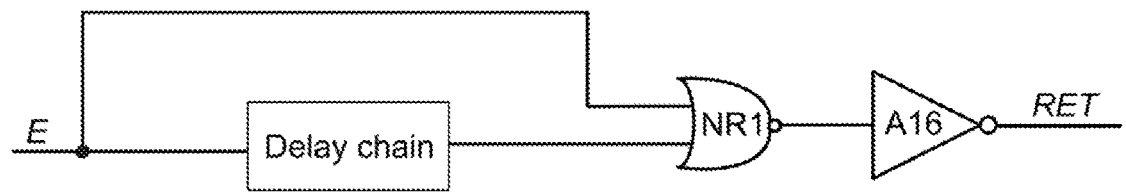
FIG. 7($a$) is a circuit diagram of a beat-frequency oscillator of the circuit aging detection sensor based on voltage comparison according to an embodiment of the invention.
Figure 7B:
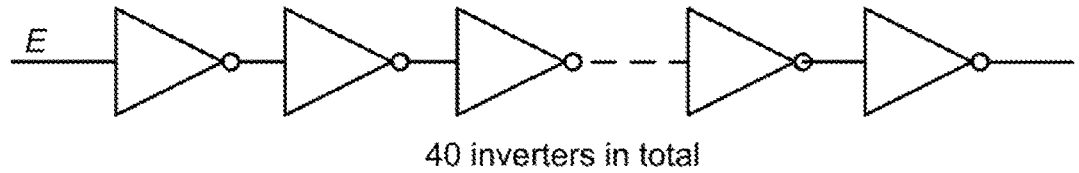

As shown in FIG. 7, in this embodiment, the beat-frequency oscillator comprises a delay chain, a sixteenth inverter A16 and a first two-input NOR gate NR1, wherein the first two-input NOR gate NR1 has a first input terminal, a second input terminal and an output terminal, an input terminal of the delay chain is connected to the first input terminal of the first two-input NOR gate NR1, a connecting terminal is the input terminal of the beat-frequency oscillator, an output terminal of the delay chain is connected to the second input terminal of the first two-input NOR gate NR1, the output terminal of the first two-input NOR gate NR1 is connected to an input terminal of the sixteenth inverter A16, and an output terminal of the sixteenth inverter A16 is the output terminal of the beat-frequency oscillator; and the delay chain is formed by series connection of 40 inverters, an input terminal of a first inverter of the 40 inverters is an input terminal of the delay chain, and an output terminal of a fortieth inverter of the 40 inverters is an output terminal of the delay chain.

Figure 8:
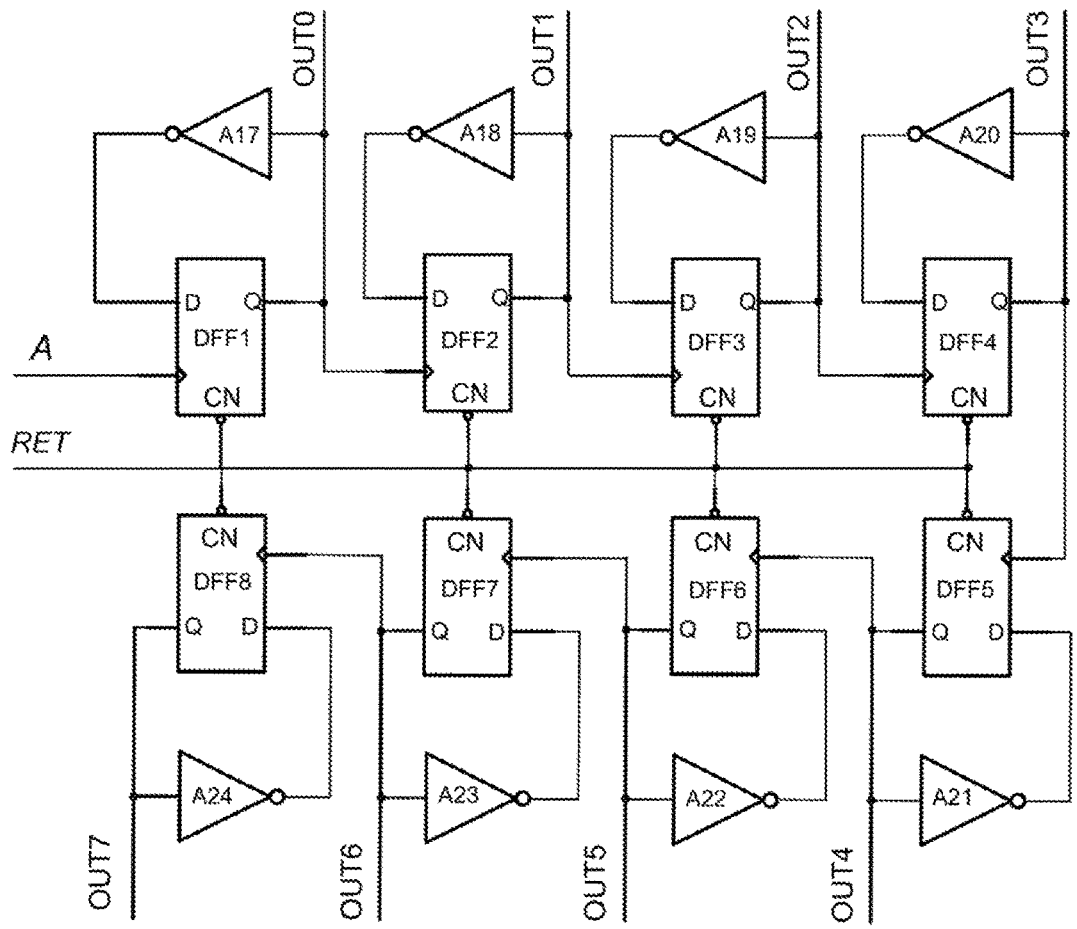
FIG. 8 is a circuit diagram of an 8-bit counter of the circuit aging detection sensor based on voltage comparison according to an embodiment of the invention.

As shown in FIG. 8, in this embodiment, the 8-bit counter comprises a seventeenth inverter A17, an eighteenth inverter A18, a nineteenth inverter A19, a twentieth inverter A20, a twenty-first inverter A21, a twenty-second inverter A22, a twenty-third inverter A23, a twenty-fourth inverter A24, a first D flip-flop DFF1, a second D flip-flop DFF2, a third D flip-flop DFF3, a fourth D flip-flop DFF4, a fifth D flip-flop DFF5, a sixth D flip-flop DFF6, a seventh D flip-flop DFF7 and an eighth D flip-flop DFF8. Each of the first D flip-flop DFF1, the second D flip-flop DFF2, the third D flip-flop DFF3, the fourth D flip-flop DFF4, the fifth D flip-flop DFF5, the sixth D flip-flop DFF6, the seventh D flip-flop DFF7 and the eighth D flip-flop DFF8 has a clock terminal, an input terminal, an output terminal and a reset terminal, wherein the reset terminals of the first D flip-flop DFF1, the second D flip-flop DFF2, the third D flip-flop DFF3, the fourth D flip-flop DFF4, the fifth D flip-flop DFF5, the sixth D flip-flop DFF6, the seventh D flip-flop DFF7 and the eighth D flip-flop DFF8 are connected, and a connecting terminal is the reset terminal of the 8-bit counter; the clock terminal of the first D flip-flop DFF1 is the input terminal of the 8-bit counter, and the input terminal of the first D flip-flop DFF1 is connected to an output terminal of the seventeenth inverter A17; the output terminal of the first D flip-flop DFF1, an input terminal of the seventeenth inverter A17 and the clock terminal of the second D flip-flop DFF2 are connected, and a connecting terminal is a first bit of the 8-bit parallel data output terminal of the 8-bit counter; the input terminal of the second D flip-flop DFF2 is connected to an output terminal of the eighteenth inverter A18; the output terminal of the second D flip-flop DFF2, an input terminal of the eighteenth inverter A18 and the clock terminal of the third D flip-flop DFF3 are connected, and a connecting terminal is a second bit of the 8-bit parallel data output terminal of the 8-bit counter; the input terminal of the third D flip-flop DFF3 is connected to an output terminal of the nineteenth inverter A19; the output terminal of the third D flip-flop DFF3, an input terminal of the nineteenth inverter A19 and the clock terminal of the fourth D flip-flop DFF4 are connected, and a connecting terminal is a third bit of the 8-bit parallel data output terminal of the 8-bit counter; the input terminal of the fourth D flip-flop DFF4 is connected to an output terminal of the twentieth inverter A20; the output terminal of the fourth D flip-flop DFF4, an input terminal of the twentieth inverter A20 and the clock terminal of the fifth D flip-flop DFF5 are connected, and a connecting terminal is a fourth bit of the 8-bit parallel data output terminal of the 8-bit counter; the input terminal of the fifth D flip-flop DFF5 is connected to an output terminal of the twenty-first inverter A21; the output terminal of the fifth D flip-flop DFF5, an input terminal of the twenty-first inverter A21 and the clock terminal of the sixth D flip-flop DFF6 are connected, and a connecting terminal is a fifth bit of the 8-bit parallel data output terminal of the 8-bit counter; the input terminal of the sixth D flip-flop DFF6 is connected to an output terminal of the twenty-second inverter A22; the output terminal of the sixth D flip-flop DFF6, an input terminal of the twenty-second inverter A22 and the clock terminal of the seventh D flip-flop DFF7 are connected, and a connecting terminal is a sixth bit of the 8-bit parallel data output terminal of the 8-bit counter; the input terminal of the seventh D flip-flop DFF7 is connected to an output terminal of the twenty-third inverter A23; the output terminal of the seventh D flip-flop DFF7, an input terminal of the twenty-third inverter A23 and the clock terminal of the eighth D flip-flop DFF8 are connected, and a connecting terminal is a seventh bit of the 8-bit parallel data output terminal of the 8-bit counter; the input terminal of the eighth D flip-flop DFF8 is connected to an output terminal of the twenty-fourth inverter A24; and an input terminal of the twenty-fourth inverter A24 and an output terminal of the eighth D flip-flop DFF8 are connected, and a connecting terminal is an eighth bit of the 8-bit parallel data output terminal of the 8-bit counter.

Figure 9:
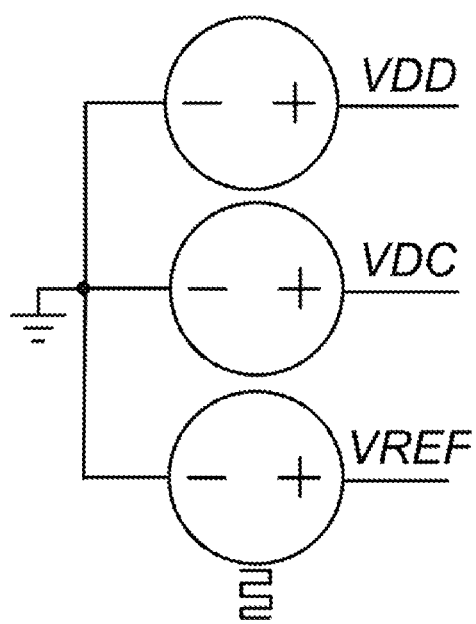
FIG. 9 is a circuit diagram of a control circuit of the circuit aging detection sensor based on voltage comparison according to an embodiment of the invention.

As shown in FIG. 9, in this embodiment, the control circuit module comprises a first DC power supply V1 for generating the aging voltage signal VDC, a second DC power supply V2 for generating the standard voltage signal VDD, and a pulse power supply V3 for generating the reference voltage signal VREF.

Figure 10:
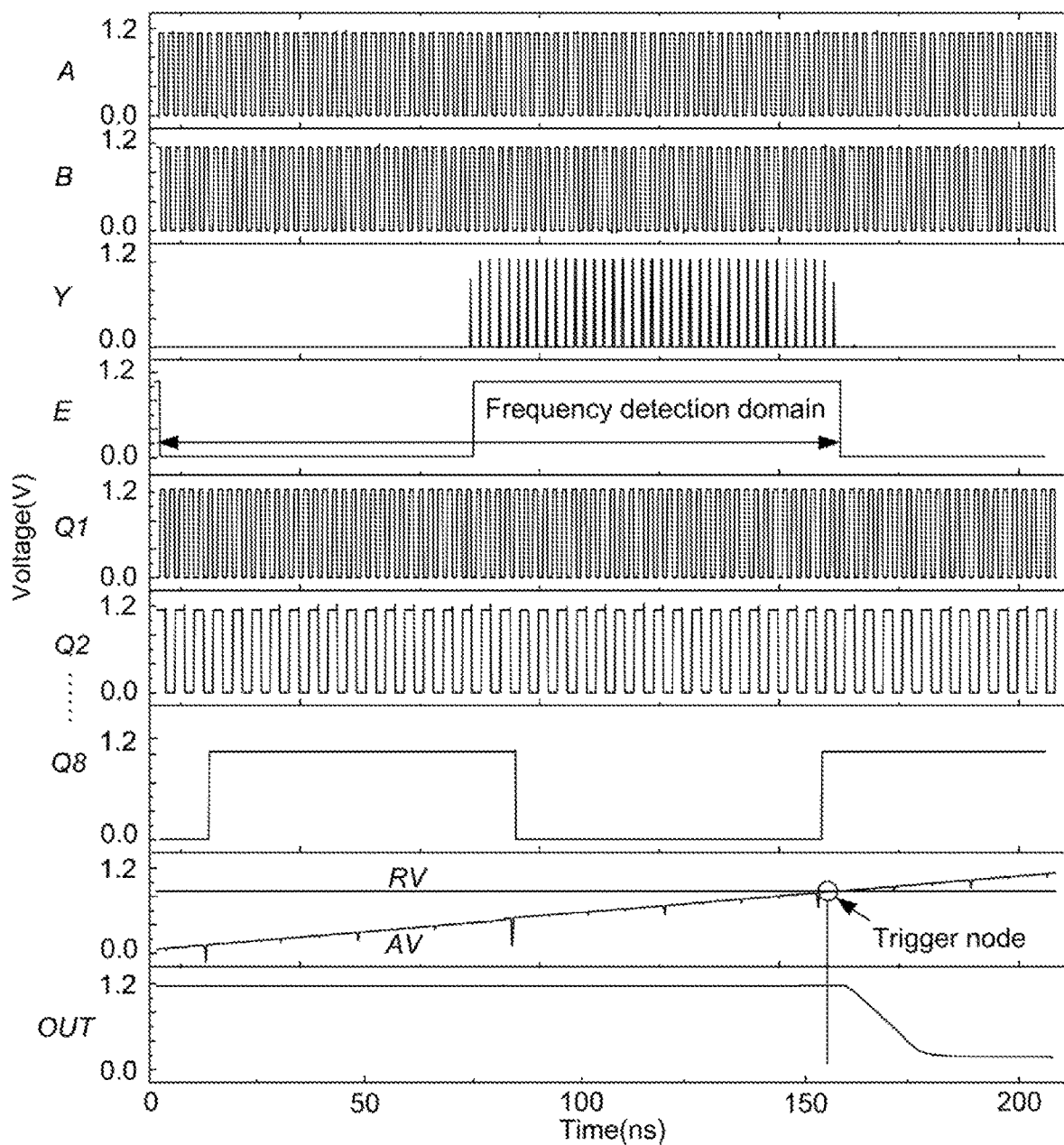
FIG. 10 is a simulated diagram of aging detection results of the circuit aging detection sensor based on voltage comparison according to an embodiment of the invention.

Under a TSMC 65 nm process, simulation verification is conducted on the circuit aging detection sensor based on voltage comparison of the invention, and a simulated diagram of aging detection results is shown by FIG. 10. As can be seen by analyzing FIG. 10, when the circuit aging detection sensor based on voltage comparison of the invention starts to operate, the output voltage of the DAC at a certain moment is 1.17V and is greater than a preset standard voltage, the voltage comparator generates a hopping signal at the voltage superposition node and outputs a low level, which indicates that the current circuit is not aged. The simulation results indicate that the circuit aging detection sensor based on voltage comparison of the invention can function correctly.

According to the invention, the quantized voltage is input to the first input terminal of the voltage comparator, the reference voltage is input to the second input terminal, and a reference voltage signal corresponds to a protective band-pass width and can be tuned according to different measurement requirements to obtain different protective band-pass widths, so that continuous tuning and good flexibility of the protective band-pass width are realized, and the detection precision is improved to a certain extent; and extra delay units do not need to be configured, so that the area overhead of circuits is reduced. Thus, the circuit aging detection sensor based on voltage comparison of the invention has good flexibility and high detection precision without extra overhead, and can be widely used for aging detection of high-precision equipment.

The invention claimed is:

1. A circuit aging detection sensor based on voltage comparison, comprising:

a control circuit, two voltage-controlled oscillators of same structure, an aging detection circuit, a serial data detector, a beat-frequency oscillator, an 8-bit counter, a digital-analog converter and a voltage comparator, wherein each voltage-controlled oscillator has an input terminal and an output terminal, the two voltage-controlled oscillators are referred to as a first voltage-controlled oscillator and a second voltage-controlled oscillator separately, the control circuit has a first voltage output terminal, a second voltage output terminal and a third voltage output terminal, the aging detection circuit has a first input terminal allowing an aging frequency to be accessed thereto, a second input terminal allowing a standard frequency to be accessed thereto, and an output terminal for outputting an aging detection signal, the serial data detector has a first input terminal allowing the aging detection signal to be accessed thereto, a second input terminal allowing the standard frequency to be accessed thereto, and an output terminal, the 8-bit counter has an input terminal, a reset terminal and an 8-bit parallel data output terminal, the digital-analog converter has an 8-bit parallel data input terminal and an output terminal, the voltage comparator has a first input terminal, a second input terminal and an output terminal, and the beat-frequency oscillator has an input terminal and an output terminal;

the first voltage output terminal of the control circuit is connected to the input terminal of the first voltage-controlled oscillator, the second voltage output terminal of the control circuit is connected to the input terminal of the second voltage-controlled oscillator, the third voltage output terminal of the control circuit is connected to the first input terminal of the voltage comparator, the output terminal of the first voltage-controlled oscillator is connected to the first input terminal of the aging detection circuit, the output terminal of the second voltage-controlled oscillator is connected to the second input terminal of the aging detection circuit, the input terminal of the 8-bit counter is connected to the second input terminal of the serial data detector, the output terminal of the aging detection circuit is connected to the first input terminal of the serial data detector, the output terminal of the serial data detector is connected to the input terminal of the beat-frequency oscillator, the output terminal of the beat-frequency oscillator is connected to the reset terminal of the 8-bit counter, the 8-bit parallel data output terminal of the 8-bit counter is connected to the 8-bit parallel data input terminal of the digital-analog converter in a one-to-one correspondence manner, the output terminal of the digital-analog converter is connected to the second input terminal of the voltage comparator, and the output terminal of the voltage comparator is an output terminal of the circuit aging detection sensor.

2. The circuit aging detection sensor based on voltage comparison according to claim 1, wherein the control circuit generates three voltage signals, wherein a first voltage signal is an aging voltage signal which is output by the first voltage output terminal, a second voltage signal is a standard voltage signal which is output by the second voltage output terminal, a third voltage signal is a reference voltage signal which is output by the third voltage output terminal, the aging voltage signal passes through the first voltage-controlled oscillator to generate an aging frequency signal, the standard voltage signal passes through the second voltage-controlled oscillator to generate a standard frequency signal, the standard frequency signal and the aging frequency signal are processed by the aging detection circuit, a frequency difference signal between the standard frequency signal and the aging frequency signal is generated by the aging detection circuit and is output by the output terminal of the aging detection circuit, the frequency difference signal and the standard frequency signal are input to the serial data detector, the standard frequency signal provides an operating frequency for the serial data detector, the serial data detector processes the frequency difference signal to extract a pulse signal from the frequency difference signal and converts the pulse signal into a level signal which serves as a frequency detection domain, the level signal passes through the beat-frequency oscillator to generate a signal RST which serves as a reset signal of the 8-bit counter, the 8-bit counter calculates the number of cycles of the standard frequency signal within the range of the frequency detection domain to quantize aging information, then the quantized aging information is converted by the digital-analog converter into a quantized voltage signal, which is input to the voltage comparator together with the reference voltage signal, the voltage comparator generates a hopping signal at a voltage superposition node of the quantified voltage signal and the reference voltage signal; if the output terminal of the voltage comparator outputs a low level at this moment, it indicates that the current circuit is not aged; or, if the output terminal of the voltage comparator outputs a high level, it indicates that the current circuit has been aged.

3. The circuit aging detection sensor based on voltage comparison according to claim 1, wherein the voltage comparator comprises a first PMOS (P-type metal-oxide-silicon, PMOS) transistor, a second PMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a tenth PMOS transistor, an eleventh PMOS transistor, a twelfth PMOS transistor, a thirteenth PMOS transistor, a fourteenth PMOS transistor, a fifteenth PMOS transistor, a sixteenth PMOS transistor, a seventeenth PMOS transistor, an eighteenth PMOS transistor, a first NMOS (N-type metal-oxide-silicon, NMOS) transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a twelfth NMOS transistor, a thirteenth NMOS transistor, a fourteenth NMOS transistor, a fifteenth NMOS transistor, a sixteenth NMOS transistor, a seventeenth NMOS transistor, a first capacitor and a second capacitor, wherein a source of the first PMOS transistor, a source of the second PMOS transistor, a source of the fourth PMOS transistor, a source of the sixth PMOS transistor, a source of the seventh PMOS transistor, a source of the ninth PMOS transistor, a source of the twelfth PMOS transistor, a source of the fourteenth PMOS transistor, a source of the sixteenth PMOS transistor and a source of the eighteenth PMOS transistor are connected, a gate of the first PMOS transistor, a drain of the first PMOS transistor, a drain of the first NMOS transistor, a gate of the third PMOS transistor, a gate of the fifth PMOS transistor, a gate of the eighth PMOS transistor, a gate of the tenth PMOS transistor, a gate of the fifteenth PMOS transistor and a gate of the seventeenth PMOS transistor are connected, a drain of the second PMOS transistor and a source of the third PMOS transistor are connected, a gate of the second PMOS transistor, a gate of the fourth PMOS transistor, a drain of the fifth PMOS transistor, a drain of the fourth NMOS transistor, a gate of the sixth PMOS transistor, a gate of the seventh PMOS transistor, a gate of the ninth PMOS transistor and a gate of the twelfth PMOS transistor are connected, a drain of the third PMOS transistor, a drain of the second NMOS transistor, a gate of the first NMOS transistor, a gate of the third NMOS transistor and a gate of the fifth NMOS transistor are connected, a drain of the fourth PMOS transistor and a source of the fifth PMOS transistor are connected, a drain of the sixth PMOS transistor, a drain of the sixth NMOS transistor, a gate of the sixth NMOS transistor, a gate of the second NMOS transistor and a gate of the fourth NMOS transistor are connected, a drain of the seventh PMOS transistor and a source of the eighth PMOS transistor are connected, a drain of the eighth PMOS transistor, a drain of the seventh NMOS transistor, a gate of the eighth NMOS transistor, a gate of the twelfth NMOS transistor, a gate of the fourteenth NMOS transistor and a gate of the sixteenth NMOS transistor are connected, a drain of the ninth PMOS transistor and a source of the tenth PMOS transistor are connected, a drain of the tenth PMOS transistor, a gate of the seventh NMOS transistor, a gate of the ninth NMOS transistor, a drain of the ninth NMOS transistor, a gate of the thirteenth NMOS transistor and a gate of the fifteenth NMOS transistor are connected, a source of the eleventh PMOS transistor, a drain of the twelfth PMOS transistor and a source of the thirteenth PMOS transistor are connected, a gate of the eleventh PMOS transistor and a gate of the tenth NMOS transistor are connected, a connecting terminal is the second input terminal of the voltage comparator, a drain of the eleventh PMOS transistor, a source of the thirteenth NMOS transistor and a drain of the fourteenth NMOS transistor are connected, a drain of the thirteenth PMOS transistor, a source of the fifteenth NMOS transistor, a drain of the sixth NMOS transistor and one terminal of the second capacitor are connected, a gate of the thirteenth PMOS transistor and a gate of the eleventh NMOS transistor are connected, a connecting terminal is the first input terminal of the voltage comparator, a drain of the fourteenth PMOS transistor, a drain of the tenth NMOS transistor and a source of the fifteenth PMOS transistor are connected, a gate of the fourteenth PMOS transistor, a drain of the fifteenth PMOS transistor, a drain of the thirteenth NMOS transistor and a gate of the sixteenth PMOS transistor are connected, a drain of the sixteenth PMOS transistor, a source of the seventeenth PMOS transistor, a drain of the eleventh NMOS transistor and one terminal of the first capacitor are connected, a drain of the seventeenth PMOS transistor, a drain of the fifteenth NMOS transistor and a gate of the seventeenth NMOS transistor are connected, a drain of the eighteenth PMOS transistor, a drain of the seventeenth NMOS transistor, the other terminal of the first capacitor and the other terminal of the second capacitor are connected, a connecting terminal is the output terminal of the voltage comparator, a source of the first NMOS transistor, a source of the third NMOS transistor, a source of the fifth NMOS transistor, a source of the sixth NMOS transistor, a source of the eighth NMOS transistor, a source of the ninth NMOS transistor, a source of the twelfth NMOS transistor, a source of the fourteenth NMOS transistor, a source of the sixteenth NMOS transistor and a source of the seventeenth NMOS transistor are connected, a source of the second NMOS transistor and a drain of the third NMOS transistor are connected, a source of the fourth NMOS transistor and a drain of the fifth NMOS transistor are connected, a source of the seventh NMOS transistor and a drain of the eighth NMOS transistor are connected, and a source of the tenth NMOS transistor, a source of the eleventh NMOS transistor and a drain of the twelfth NMOS transistor are connected.

4. The circuit aging detection sensor based on voltage comparison according to claim 1, wherein each voltage-controlled oscillator comprises 37 VCO (voltage-controlled oscillator, VCO) cells, wherein each VCO cell has a first input terminal, a second input terminal, a first output terminal, a second output terminal and a power terminal, a power supply is accessed to the power terminals of the 37 VCO cells, the first input terminal of the first VCO cell is connected to the first output terminal of the thirty-seventh VCO cell, a connecting terminal is the output terminal of the voltage-controlled oscillator, the second input terminal of the first VCO cell is connected to the second output terminal of the thirty-seventh VCO cell, the first output terminal of the 0 VCO cell is connected to the first input terminal of the $(k+1)^{th}$ VCO cell, the second output terminal of the $k^{th}$ VCO cell is connected to the second input terminal of the $(k+1)^{th}$ VCO cell, and k=1, 2, . . . , 36, each VCO cell comprises a nineteenth PMOS transistor, a twentieth PMOS transistor, an eighteenth NMOS transistor and a nineteenth NMOS transistor, wherein a source of the nineteenth PMOS transistor and a source of the twentieth PMOS transistor are connected, and a connecting terminal is the power terminal of the VCO cell; a gate of the nineteenth PMOS transistor, a drain of the twentieth PMOS transistor and a drain of the nineteenth NMOS transistor are connected, and a connecting terminal is the first output terminal of the VCO cell; a drain of the nineteenth PMOS transistor, a gate of the twentieth PMOS transistor and a drain of the eighteenth NMOS transistor are connected, and a connecting terminal is the second output terminal of the VCO cell; a gate of the eighteenth NMOS transistor is the first input terminal of the VCO cell; a gate of the nineteenth NMOS transistor is the second input terminal of the VCO cell; and a source of the eighteenth NMOS transistor and a source of the nineteenth NMOS transistor are grounded.

5. The circuit aging detection sensor based on voltage comparison according to claim 1, wherein the aging detection circuit comprises a twenty-first PMOS transistor, a twenty-second PMOS transistor, a twentieth NMOS transistor, a twenty-first NMOS transistor, a twenty-second NMOS transistor, a first inverter, a second inverter, a third inverter and a first two-input AND gate, wherein the first two-input AND gate has a first input terminal, a second input terminal and an output terminal, a power supply is accessed to a source of the twenty-first PMOS transistor and a source of the twenty-second PMOS transistor, a drain of the twenty-first PMOS transistor, a drain of the twentieth NMOS transistor, a gate of the twenty-second PMOS transistor and an input terminal of the first inverter are connected, a drain of the twenty-second PMOS transistor, an output terminal of the first inverter, a drain of the twenty-second NMOS transistor and an input terminal of the second inverter are connected, a gate of the twentieth NMOS transistor and the output terminal of the first two-input AND gate are connected, a source of the twentieth NMOS transistor and a drain of the twenty-first NMOS transistor are connected, a source of the twenty-first NMOS transistor and a source of the twenty-second NMOS transistor are grounded, a gate of the twenty-second NMOS transistor, an output terminal of the second inverter and an input terminal of the third inverter are connected, an output terminal of the third inverter is the output terminal of the aging detection circuit, the first input terminal of the first two-input AND gate, a gate of the twenty-first PMOS transistor and a gate of the twenty-first NMOS transistor are connected, a connecting terminal is the first input terminal of the aging detection circuit, and the second input terminal of the first two-input AND gate is the second input terminal of the aging detection circuit.

6. The circuit aging detection sensor based on voltage comparison according to claim 1, wherein the serial data detector comprises a twenty-third PMOS transistor, a twenty-fourth PMOS transistor, a twenty-fifth PMOS transistor, a twenty-sixth PMOS transistor, a twenty-seventh PMOS transistor, a twenty-eighth PMOS transistor, a twenty-ninth PMOS transistor, a thirtieth PMOS transistor, a thirty-first PMOS transistor, a thirty-second PMOS transistor, a thirty-third PMOS transistor, a thirty-fourth PMOS transistor, a twenty-third NMOS transistor, a twenty-fourth NMOS transistor, a twenty-fifth NMOS transistor, a twenty-sixth NMOS transistor, a twenty-seventh NMOS transistor, a twenty-eighth NMOS transistor, a twenty-ninth NMOS transistor, a thirtieth NMOS transistor, a thirty-first NMOS transistor, a thirty-second NMOS transistor, a thirty-third NMOS transistor, a thirty-fourth NMOS transistor, a second two-input AND gate, a third two-input AND gate, a fourth two-input AND gate, a first two-input NAND gate, a second two-input NAND gate, a fourth inverter, a fifth inverter, a sixth inverter, a seventh inverter, an eighth inverter, a ninth inverter, a tenth inverter, an eleventh inverter, a twelfth inverter, a thirteenth inverter, a fourteenth inverter and a fifteenth inverter, wherein each of the second two-input AND gate, the third two-input AND gate, the fourth two-input AND gate, the first two-input NAND gate and the second two-input NAND gate has a first input terminal, a second input terminal and an output terminal, a power supply is accessed to a source of the twenty-third PMOS transistor, a source of the twenty-fourth PMOS transistor, a source of the twenty-ninth PMOS transistor and a source of the thirtieth PMOS transistor, a gate of the twenty-third PMOS transistor, a gate of the twenty-ninth PMOS transistor, a gate of the twenty-fourth NMOS transistor, a gate of the thirtieth NMOS transistor, a gate of the thirty-first NMOS transistor, an output terminal of the tenth inverter, a gate of the thirty-third NMOS transistor, a gate of the thirty-second PMOS transistor and a gate of the thirty-fourth PMOS transistor are connected, a drain of the twenty-third PMOS transistor and a source of the twenty-fifth PMOS transistor are connected, a gate of the twenty-fourth PMOS transistor, an output terminal of the fourth inverter, a drain of the thirty-first PMOS transistor, a drain of the thirty-first NMOS transistor and a gate of the twenty-sixth NMOS transistor are connected, a drain of the twenty-fourth PMOS transistor and a source of the twenty-sixth PMOS transistor are connected, a gate of the twenty-fifth PMOS transistor, a gate of the twenty-third NMOS transistor and the output terminal of the second two-input AND gate are connected, a drain of the twenty-fifth PMOS transistor, a drain of the twenty-third NMOS transistor, a drain of the twenty-sixth PMOS transistor, a drain of the twenty-fourth NMOS transistor and an input terminal of the fourth inverter are connected, a gate of the twenty-sixth PMOS transistor, a gate of the twenty-fifth NMOS transistor, a gate of the twenty-seventh NMOS transistor, a gate of the twenty-eighth PMOS transistor, a gate of the thirty-first PMOS transistor, an output terminal of the ninth inverter, an input terminal of the tenth inverter, a gate of the thirty-third PMOS transistor, a gate of the thirty-second NMOS transistor and a gate of the thirty-fourth NMOS transistor are connected, a gate of the twenty-seventh PMOS transistor, a gate of the twenty-ninth NMOS transistor and the output terminal of the third two-input AND gate are connected, a source of the twenty-seventh PMOS transistor and a drain of the twenty-ninth PMOS transistor are connected, a drain of the twenty-seventh PMOS transistor, a drain of the twenty-ninth NMOS transistor, a drain of the thirtieth NMOS transistor, a drain of the twenty-eighth PMOS transistor and an input terminal of the twelfth inverter are connected, a source of the twenty-eighth PMOS transistor and a drain of the thirtieth PMOS transistor are connected, a gate of the thirtieth PMOS transistor, an output terminal of the twelfth inverter, a gate of the twenty-eighth NMOS transistor, a drain of the thirty-third NMOS transistor and a drain of the thirty-third PMOS transistor are connected, a source of the thirty-first PMOS transistor, a source of the thirty-first NMOS transistor, a drain of the thirty-second PMOS transistor, a drain of the thirty-second NMOS transistor and an input terminal of the fifth inverter are connected, a source of the thirty-second PMOS transistor, a source of the thirty-second NMOS transistor, an output terminal of the sixth inverter and an input terminal of the seventh inverter are connected, a source of the thirty-third PMOS transistor, a source of the thirty-third NMOS transistor, a drain of the thirty-fourth NMOS transistor, a drain of the thirty-fourth PMOS transistor and an input terminal of the thirteenth inverter are connected, a source of the thirty-fourth PMOS transistor, a source of the thirty-fourth NMOS transistor, an output terminal of the fourteenth inverter and an input terminal of the fifteenth inverter are connected, a source of the twenty-third NMOS transistor and a drain of the twenty-fifth NMOS transistor are connected, a source of the twenty-fourth NMOS transistor and a drain of the twenty-sixth NMOS transistor are connected, a source of the twenty-fifth NMOS transistor, a source of the twenty-sixth NMOS transistor, a source of the twenty-seventh NMOS transistor and a source of the twenty-eighth NMOS transistor are grounded, a drain of the twenty-seventh NMOS transistor and a source of the twenty-ninth NMOS transistor are connected, a drain of the twenty-eighth NMOS transistor and a source of the thirtieth NMOS transistor are connected, the first input terminal of the first two-input NAND gate, an output terminal of the eighth inverter and the first input terminal of the fourth two-input AND gate are connected, the second input terminal of the first two-input NAND gate, the second input terminal of the second two-input NAND gate and an output terminal of the fifteenth inverter are connected, the output terminal of the first two-input NAND gate and the second input terminal of the second two-input AND gate are connected, the first input terminal of the second two-input NAND gate and an output terminal of the seventh inverter are connected, the output terminal of the second two-input NAND gate and the second input terminal of the third two-input AND gate are connected, the first input terminal of the second two-input AND gate and the first input terminal of the third two-input AND gate are connected, a connecting terminal is the first input terminal of the serial data detector, the second input terminal of the fourth two-input AND gate and an output terminal of the eleventh inverter are connected, the output terminal of the fourth two-input AND gate is the output terminal of the serial data detector, an output terminal of the fifth inverter, an input terminal of the sixth inverter and an input terminal of the eighth inverter are connected, an input terminal of the ninth inverter is the second input terminal of the serial data detector, and an input terminal of the eleventh inverter, an output terminal of the thirteenth inverter and an input terminal of the fourteenth inverter are connected.

7. The circuit aging detection sensor based on voltage comparison according to claim 1, wherein the beat-frequency oscillator comprises a delay chain, a sixteenth inverter and a first two-input NOR gate, wherein the first two-input NOR gate has a first input terminal, a second input terminal and an output terminal, an input terminal of the delay chain is connected to the first input terminal of the first two-input NOR gate, a connecting terminal is the input terminal of the beat-frequency oscillator, an output terminal of the delay chain is connected to the second input terminal of the first two-input NOR gate, the output terminal of the first two-input NOR gate is connected to an input terminal of the sixteenth inverter, and an output terminal of the sixteenth inverter is the output terminal of the beat-frequency oscillator; and the delay chain is formed by series connection of 40 inverters, an input terminal of a first inverter of the 40 inverters is an input terminal of the delay chain, and an output terminal of a fortieth inverter of the 40 inverters is an output terminal of the delay chain.

8. The circuit aging detection sensor based on voltage comparison according to claim 1, wherein the 8-bit counter comprises a seventeenth inverter, an eighteenth inverter, a nineteenth inverter, a twentieth inverter, a twenty-first inverter, a twenty-second inverter, a twenty-third inverter, a twenty-fourth inverter, a first D flip-flop, a second D flip-flop, a third D flip-flop, a fourth D flip-flop, a fifth D flip-flop, a sixth D flip-flop, a seventh D flip-flop and an eighth D flip-flop, wherein each of the first D flip-flop, the second D flip-flop, the third D flip-flop, the fourth D flip-flop, the fifth D flip-flop, the sixth D flip-flop, the seventh D flip-flop and the eighth D flip-flop has a clock terminal, an input terminal, an output terminal and a reset terminal, wherein the reset terminals of the first D flip-flop, the second D flip-flop, the third D flip-flop, the fourth D flip-flop, the fifth D flip-flop, the sixth D flip-flop, the seventh D flip-flop and the eighth D flip-flop are connected, and a connecting terminal is the reset terminal of the 8-bit counter; the clock terminal of the first D flip-flop is the input terminal of the 8-bit counter, and the input terminal of the first D flip-flop is connected to an output terminal of the seventeenth inverter; the output terminal of the first D flip-flop, an input terminal of the seventeenth inverter and the clock terminal of the second D flip-flop are connected, and a connecting terminal is a first bit of the 8-bit parallel data output terminal of the 8-bit counter; the input terminal of the second D flip-flop is connected to an output terminal of the eighteenth inverter; the output terminal of the second D flip-flop, an input terminal of the eighteenth inverter and the clock terminal of the third D flip-flop are connected, and a connecting terminal is a second bit of the 8-bit parallel data output terminal of the 8-bit counter; the input terminal of the third D flip-flop is connected to an output terminal of the nineteenth inverter; the output terminal of the third D flip-flop, an input terminal of the nineteenth inverter and the clock terminal of the fourth D flip-flop are connected, and a connecting terminal is a third bit of the 8-bit parallel data output terminal of the 8-bit counter; the input terminal of the fourth D flip-flop is connected to an output terminal of the twentieth inverter; the output terminal of the fourth D flip-flop, an input terminal of the twentieth inverter and the clock terminal of the fifth D flip-flop are connected, and a connecting terminal is a fourth bit of the 8-bit parallel data output terminal of the 8-bit counter; the input terminal of the fifth D flip-flop is connected to an output terminal of the twenty-first inverter; the output terminal of the fifth D flip-flop, an input terminal of the twenty-first inverter and the clock terminal of the sixth D flip-flop are connected, and a connecting terminal is a fifth bit of the 8-bit parallel data output terminal of the 8-bit counter; the input terminal of the sixth D flip-flop is connected to an output terminal of the twenty-second inverter; the output terminal of the sixth D flip-flop, an input terminal of the twenty-second inverter and the clock terminal of the seventh D flip-flop are connected, and a connecting terminal is a sixth bit of the 8-bit parallel data output terminal of the 8-bit counter; the input terminal of the seventh D flip-flop is connected to an output terminal of the twenty-third inverter; the output terminal of the seventh D flip-flop, an input terminal of the twenty-third inverter and the clock terminal of the eighth D flip-flop are connected, and a connecting terminal is a seventh bit of the 8-bit parallel data output terminal of the 8-bit counter; the input terminal of the eighth D flip-flop is connected to an output terminal of the twenty-fourth inverter; and an input terminal of the twenty-fourth inverter and an output terminal of the eighth D flip-flop are connected, and a connecting terminal is an eighth bit of the 8-bit parallel data output terminal of the 8-bit counter.

* * * * *